United States Patent
Ko et al.

(10) Patent No.: US 12,255,187 B2
(45) Date of Patent: Mar. 18, 2025

(54) DISPLAY DEVICE USING SEMICONDUCTOR LIGHT-EMITTING ELEMENT AND MANUFACTURING METHOD THEREFOR

(71) Applicant: LG ELECTRONICS INC., Seoul (KR)

(72) Inventors: Jisoo Ko, Seoul (KR); Hyeyoung Yang, Seoul (KR); Wonjae Chang, Seoul (KR); Hyunwoo Cho, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 519 days.

(21) Appl. No.: 17/623,853

(22) PCT Filed: Aug. 1, 2019

(86) PCT No.: PCT/KR2019/009630
§ 371 (c)(1),
(2) Date: Dec. 29, 2021

(87) PCT Pub. No.: WO2021/015350
PCT Pub. Date: Jan. 28, 2021

(65) Prior Publication Data
US 2022/0367421 A1 Nov. 17, 2022

(30) Foreign Application Priority Data
Jul. 19, 2019 (KR) .................... 10-2019-0087643

(51) Int. Cl.
*H01L 25/075* (2006.01)
*H01L 23/00* (2006.01)
*H01L 33/62* (2010.01)

(52) U.S. Cl.
CPC .......... *H01L 25/0753* (2013.01); *H01L 33/62* (2013.01); *H01L 24/24* (2013.01);
(Continued)

(58) Field of Classification Search
CPC ..... H01L 33/00–648; H01L 27/15–156; H01L 2933/00–0091
See application file for complete search history.

(56) References Cited

U.S. PATENT DOCUMENTS

| | | | |
|---|---|---|---|
| 2013/0214302 A1 | 8/2013 | Yeh et al. | |
| 2017/0104036 A1* | 4/2017 | Maeda | H10K 59/35 |
| 2017/0338372 A1 | 11/2017 | Teraguchi et al. | |
| 2019/0081025 A1* | 3/2019 | Chang | H01L 33/007 |
| 2019/0198561 A1* | 6/2019 | Wildeson | H04B 10/116 |

FOREIGN PATENT DOCUMENTS

| | | |
|---|---|---|
| KR | 1020170026956 | 3/2017 |
| KR | 10-2017-0096127 | 8/2017 |

(Continued)

OTHER PUBLICATIONS

Korean Intellectual Property Office Application No. 10-2019-0087643, Notice of Allowance dated Dec. 13, 2023, 5 pages.

(Continued)

*Primary Examiner* — Evren Seven
*Assistant Examiner* — Cole Leon Lindsey
(74) *Attorney, Agent, or Firm* — LEE, HONG, DEGERMAN, KANG & WAIMEY

(57) ABSTRACT

The present invention may be applied to display device-related technical fields and relates to a display device using a semiconductor light-emitting element, such as a micro light-emitting diode (LED), and a manufacturing method therefor. The present invention, according to one embodiment, may comprise: a substrate; a stepped film positioned on at least some pixel regions, among a plurality of individual pixel regions positioned on the substrate; an assembly electrode positioned on the substrate or the stepped film; an (Continued)

insulation layer positioned on the assembly electrode; a partition wall positioned on the insulation layer and defining an assembly groove having mounted therein a semiconductor light-emitting element forming the individual pixel; the semiconductor light-emitting element mounted in an assembly surface of the assembly groove; and a lighting electrode electrically connected to the semiconductor light-emitting element.

18 Claims, 26 Drawing Sheets

(52) U.S. Cl.
CPC .............. *H01L 2224/24225* (2013.01); *H01L 2933/0066* (2013.01)

(56) References Cited

FOREIGN PATENT DOCUMENTS

| KR | 1020170095914 | 8/2017 |
| KR | 1020190029343 | 3/2019 |
| KR | 1020190057681 | 5/2019 |
| KR | 1020190075869 | 7/2019 |

OTHER PUBLICATIONS

PCT International Application No. PCT/KR2019/009630, International Search Report dated Apr. 17, 2020, 16 pages.
Korean Intellectual Property Office Application No. 10-2019-0087643, Notice of Allowance dated Aug. 6, 2024, 7 pages.

\* cited by examiner

DISPLAY DEVICE USING SEMICONDUCTOR LIGHT-EMITTING ELEMENT AND MANUFACTURING METHOD THEREFOR

CROSS-REFERENCE TO RELATED APPLICATIONS

This application is the National Stage filing under 35 U.S.C. 371 of International Application No. PCT/KR2019/009630, filed on Aug. 1, 2019, which claims the benefit of earlier filing date and right of priority to Korean Application No. 10-2019-0087643, filed on Jul. 19, 2019, the contents of which are all hereby incorporated by reference herein their entirety.

TECHNICAL FIELD

The present disclosure is applicable to the display device related technical fields and relates to a display device using a semiconductor light-emitting element, e.g., a micro Light Emitting Diode (LED) and method for fabricating the same.

BACKGROUND ART

Recently, in a field of a display technology, display devices having excellent characteristics such as thinness, flexibility, and the like have been developed. On the other hand, currently commercialized major displays are represented by a LCD (liquid crystal display) and an OLED (organic light emitting diode).

However, the LCD has a response time that is not fast, and is difficult to be flexibly implemented.

On the other hand, LED (light emitting diode), which is a well-known semiconductor light-emitting element that converts electric current into light, has been used as a light source for a display image of an electronic device including an information and communication device along with a GaP:N-based green LED, starting with commercialization of a red LED using a GaAsP compound semiconductor in 1962. Accordingly, a method for solving the above-described problems by implementing a display using the semiconductor light-emitting element may be proposed. Such light emitting diode has various advantages, such as long lifespan, low power consumption, excellent initial driving characteristics, high vibration resistance, and the like, compared to a filament-based light-emitting element.

Such a light emitting element should be assembled and connected electrically to an individual pixel area so as to be used as a pixel of a display device.

For the light emitting element assembly, a self-assembly method using an electromagnetic field may be used.

However, in some cases, when self-assembly of a light emitting element is performed, it may happen that the light emitting element is attached to a position other than an individual pixel area.

Specifically, this phenomenon may further increase as a distance between electrodes for self-assembly is narrowed for miniaturization and high resolution of an LED chip. That is, as a distance between electrodes and a distance between pixels are narrowed, interference of an electric field in an adjacent pixel area may occur. Therefore, a phenomenon in which a light emitting element is attached to a surface of a substrate in an area other than an assembly groove may become more frequent due to such electric field interference.

Accordingly, there is a need for a method for preventing such a phenomenon and assembling a light emitting element at an accurate position.

DISCLOSURE

Technical Task

One technical task of the present disclosure is to provide a display device and method for fabricating the same, which may prevent a phenomenon in which a light emitting element is attached to a position other than an individual pixel area in the course of assembling a semiconductor light emitting element on a substrate.

Another technical task of the present disclosure is to provide a display device and method for fabricating the same, which may prevent interference of an electric field in each pixel area and a phenomenon in which a light emitting element chip is assembled in an area other than a pixel area.

Technical Solutions

According to one embodiment of the present disclosure, height may be set different per pixel in a display device using a semiconductor light emitting element.

Accordingly, using a step difference per pixel area, interference of an electric field in each pixel area may be prevented and a phenomenon in which a light emitting element chip is assembled in an area other than a pixel area may be prevented.

For specific example, the present disclosure is characterized in having a step difference layer located in at least some of a multitude of individual pixel areas.

In one technical aspect of the present disclosure, provided is a display device using a semiconductor light emitting element, the display device including a substrate, a step difference layer located in at least some pixel areas among a multitude of individual pixel areas located on the substrate, an assembly electrode located on the substrate or the step difference layer, an insulating layer located on the assembly electrode, a partition wall located on the insulating layer to define an assembly groove in which the semiconductor light emitting element configuring the individual pixel is installed, the semiconductor light emitting element installed on an assembly side of the assembly groove, and a lighting electrode connected electrically to the semiconductor light emitting element.

A height of the partition wall may be changed in an area between the individual pixels by the step difference layer.

The partition wall may include a step shape in the area between the individual pixels.

A multitude of the individual pixel areas may include a red area, a green area and a blue area and the assembly side of one of the red, green and blue areas may differ from the assembly side of each of the rest of the two areas in height due to the step difference layer.

The assembly sides of the areas neighboring each other among the red, green and blue areas may differ from each other in height.

A multitude of the individual pixel areas may include a red area, a green area and a blue area and assembly sides of the red, green and blue areas may differ from each other in height due to the step difference layer.

Heights of the assembly sides of the red, green and blue areas may change sequentially.

A protective layer may be further included between the light emitting element and the lighting electrode.

The protective layer may planarize the height difference caused by the step difference layer.

In another technical aspect of the present disclosure, provided is a method of fabricating a display device using a semiconductor light emitting element, the method including forming a step difference layer on at least some pixel areas among a multitude of individual pixel areas including first to third areas repeatedly located on a substrate, forming an assembly electrode on the substrate or the step difference layer, forming an insulating layer on the assembly electrode, forming a partition wall on the insulating layer to define an assembly groove in which the semiconductor light emitting element configuring the individual pixel is installed, installing the semiconductor light emitting element on an assembly side of the assembly groove, and forming a lighting electrode connected electrically to the semiconductor light emitting element.

The forming the step difference layer may include forming the step difference layer in at least one of the first area, the second area, or the third area.

The forming the step difference layer may include forming a first step difference layer covering two of the first to third areas.

The first step difference layer may be formed alternately in the first to third areas.

The first step difference layer may be formed continuously in two of the first to third areas.

The method may further include forming a second step difference layer covering one of the two areas continuously formed on the first step difference layer Advantageous Effects According to one embodiment of the present disclosure, it is possible to prevent an interference phenomenon in which an electric field may act between pixel areas due to a height difference of an assembly side of each pixel area, thereby preventing a light emitting element from being attached to a substrate surface other than an assembly groove.

In addition, even though the height difference is not significant, that is, even if some interfering electric fields exist, since a surface between the pixel areas is not flat (step shape), influence of a magnetic force becomes greater than that of the interfering electric field, so that a chip may be dragged and attached to the assembly groove in the course of a self-assembly process.

Furthermore, according to another embodiment of the present disclosure, there are additional effects not mentioned herein. Those of ordinary skill in the art may understand it through the full text of the specification and drawings.

BEST MODE FOR DISCLOSURE

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a display device.

In addition, the semiconductor light emitting element mentioned in this specification is a concept including an LED, a micro LED, and the like.

Figure 1:
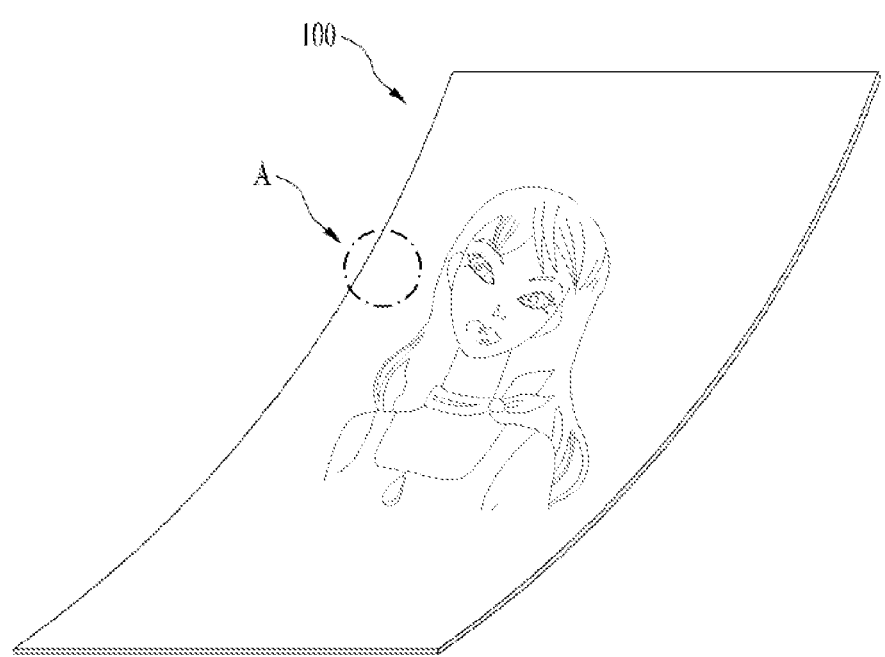
FIG. 1 is a conceptual diagram illustrating an embodiment of a display device using a semiconductor light emitting element according to the present disclosure.

FIG. 1 is a conceptual view illustrating an embodiment of a display device using a semiconductor light emitting element according to the present disclosure.

As shown in FIG. 1, information processed by a controller (not shown) of a display device 100 may be displayed using a flexible display.

The flexible display may include, for example, a display that can be warped, bent, twisted, folded, or rolled by external force.

Furthermore, the flexible display may be, for example, a display manufactured on a thin and flexible substrate that can be warped, bent, folded, or rolled like paper while maintaining the display characteristics of a conventional flat panel display.

When the flexible display remains in an unbent state (e.g., a state having an infinite radius of curvature) (hereinafter referred to as a first state), the display area of the flexible display forms a flat surface. When the display in the first sate is changed to a bent state (e.g., a state having a finite radius of curvature) (hereinafter referred to as a second state) by external force, the display area may be a curved surface. As shown in FIG. 1, the information displayed in the second state may be visual information output on a curved surface. Such visual information may be implemented by independently controlling the light emission of sub-pixels arranged in a matrix form. The unit pixel may mean, for example, a minimum unit for implementing one color.

The unit pixel of the flexible display may be implemented by a semiconductor light emitting element. In the present disclosure, a light emitting diode (LED) is exemplified as a type of the semiconductor light emitting element configured to convert electric current into light. The LED may be formed in a small size, and may thus serve as a unit pixel even in the second state.

Hereinafter, a flexible display implemented using the LED will be described in more detail with reference to the drawings.

Figure 2:
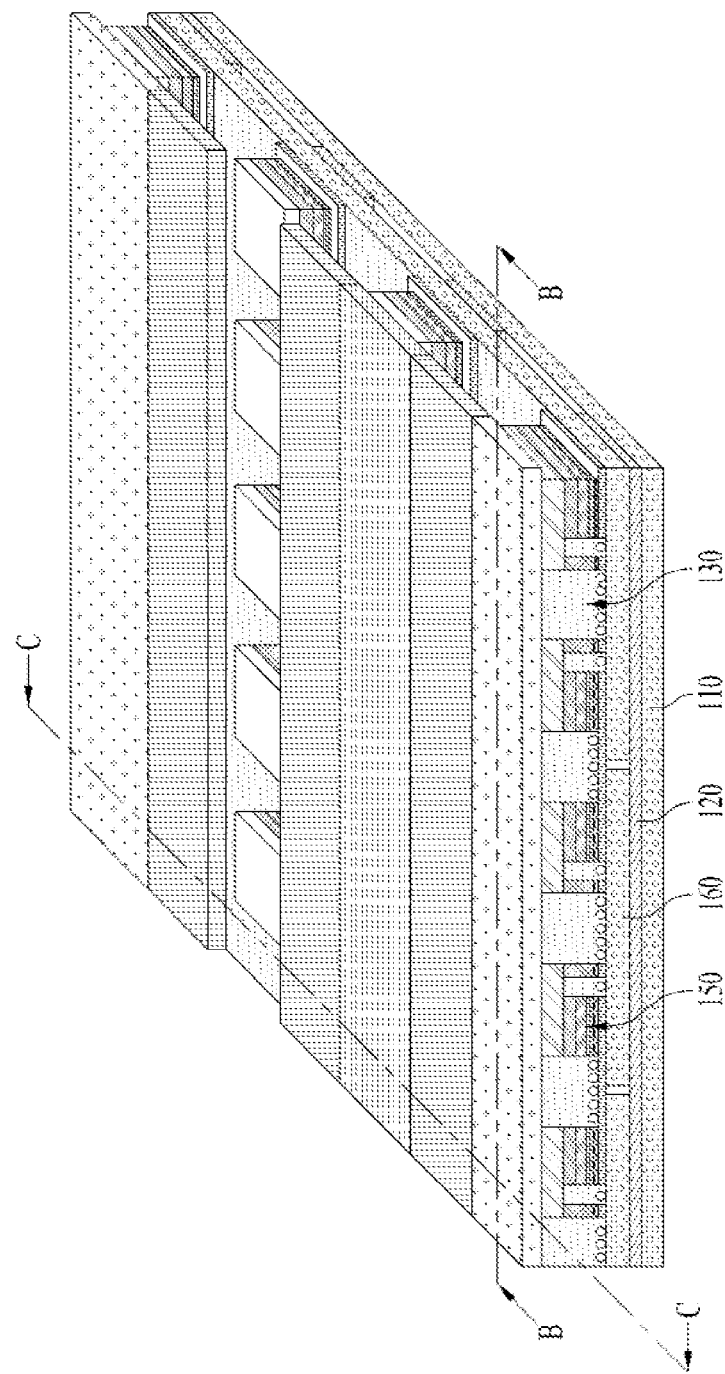
FIG. 2 is a partially enlarged diagram showing a part A shown in FIG. 1.

FIG. 2 is a partially enlarged view showing part A of FIG. 1.

Figure 3A:
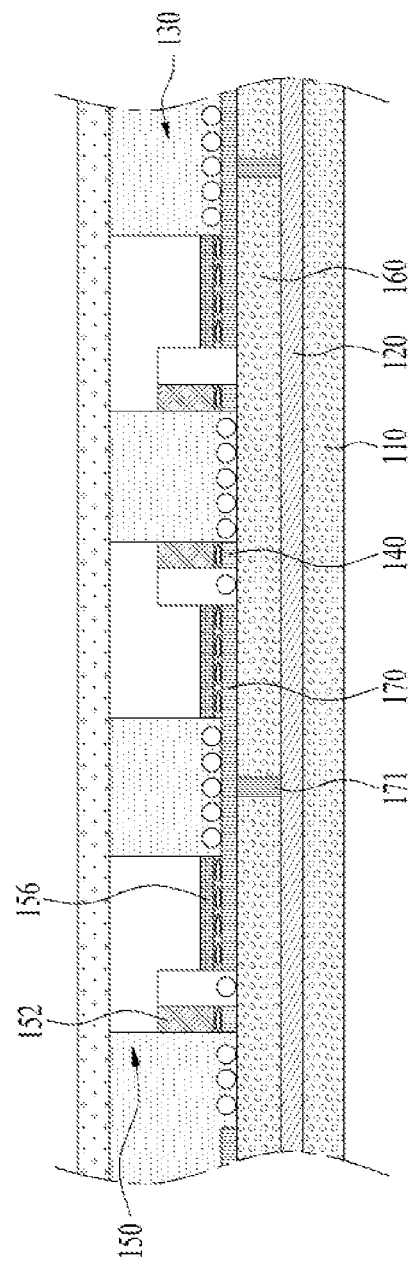
FIGS. 3A and 3B are cross-sectional diagrams taken along the cutting lines B-B and C-C in FIG. 2.
Figure 3B:
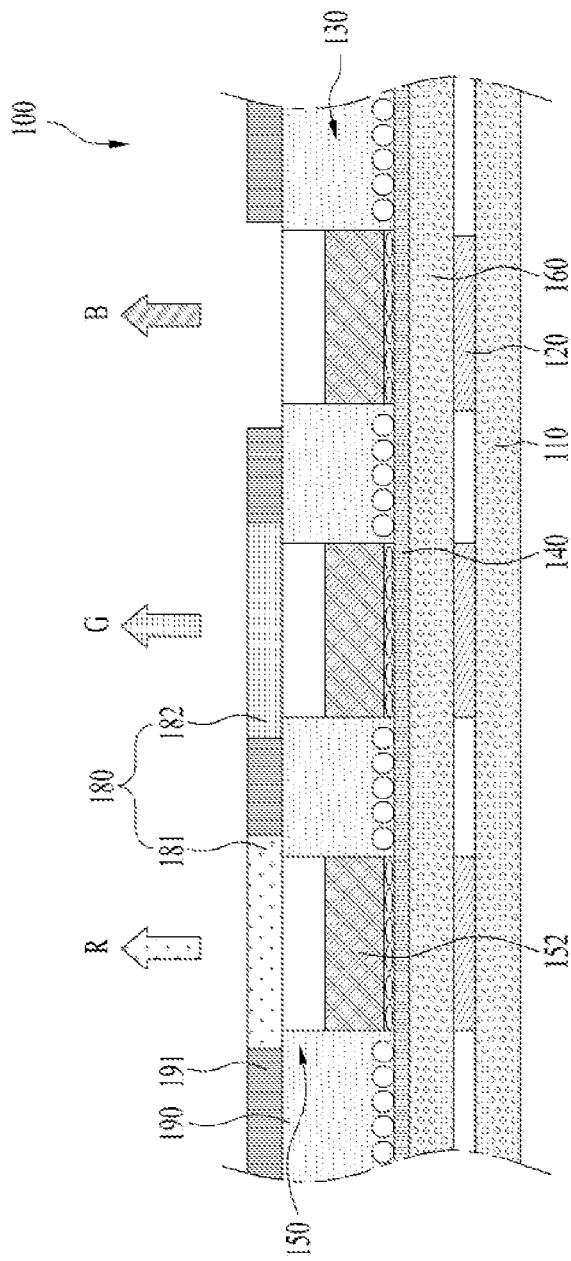

FIGS. 3A and 3B are cross-sectional views taken along lines B-B and C-C in FIG. 2.

Figure 4:
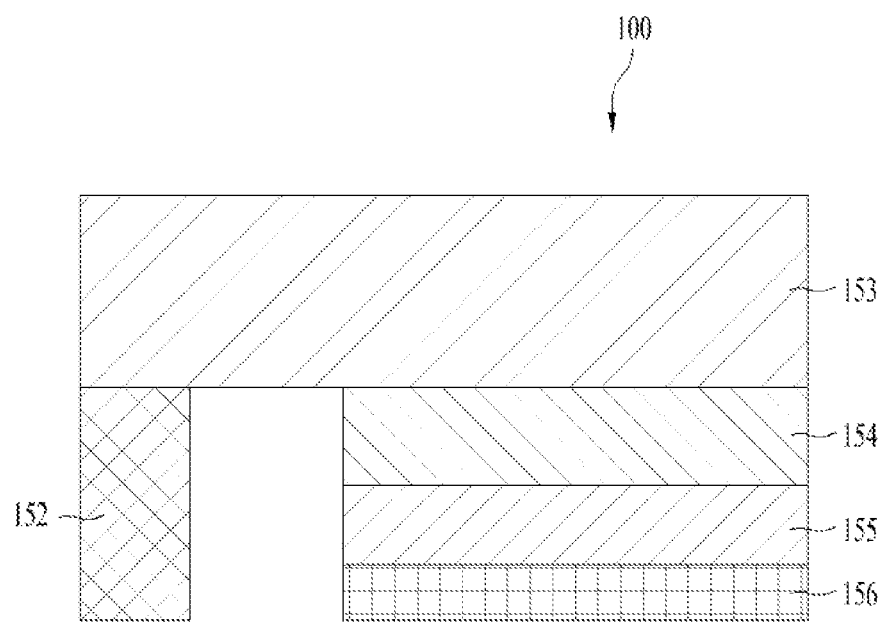
FIG. 4 is a conceptual diagram illustrating the flip-chip type semiconductor light emitting element of FIG. 3.

FIG. 4 is a conceptual view illustrating the flip-chip type semiconductor light emitting element of FIG. 3.

Figure 5A:
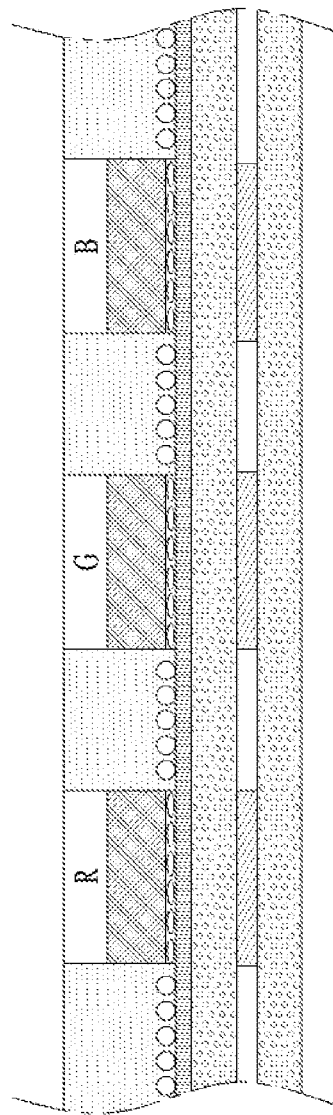
FIGS. 5A to 5C are conceptual diagrams illustrating various examples of color implementation with respect to a flip-chip type semiconductor light emitting element.
Figure 5B:
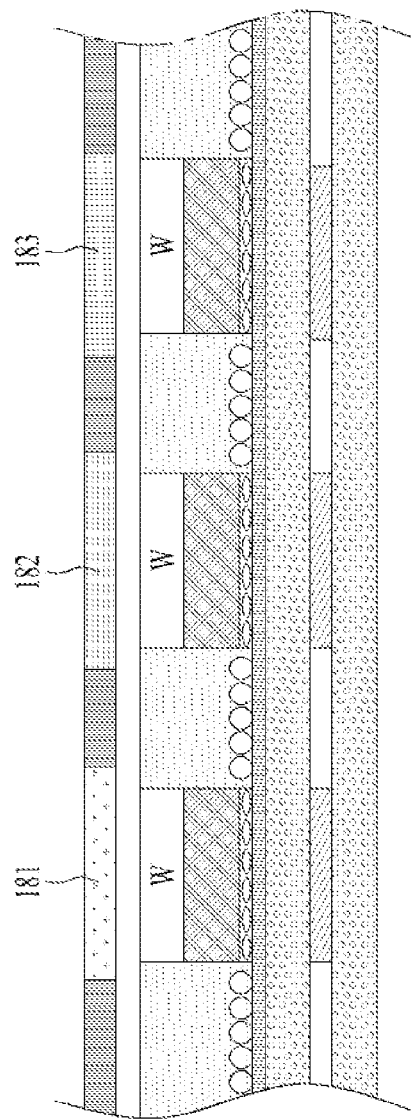
Figure 5C:
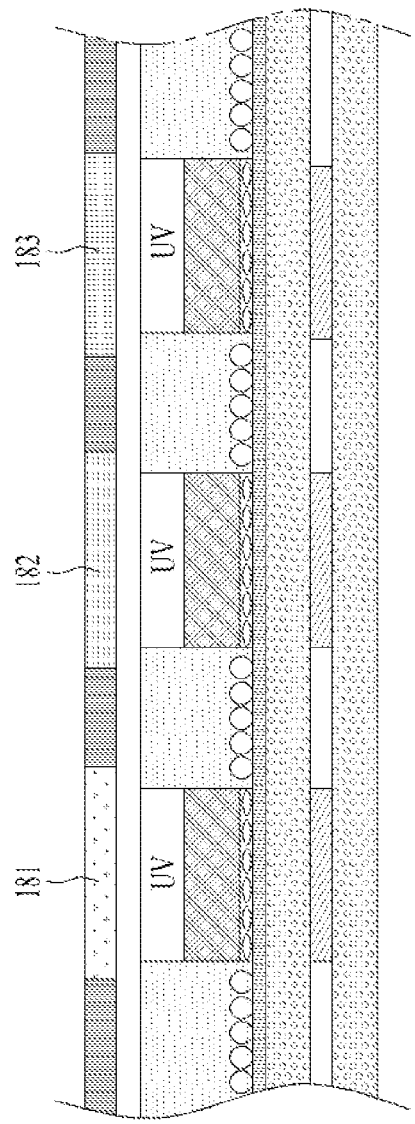

FIGS. 5A to 5C are conceptual views illustrating various examples of implementation of colors in relation to a flip-chip type semiconductor light emitting element.

As shown in FIGS. 2, 3A and 3B, the display device 100 using a passive matrix (PM) type semiconductor light emitting element is exemplified as the display device 100 using a semiconductor light emitting element. However, the examples described below are also applicable to an active matrix (AM) type semiconductor light emitting element.

The display device 100 shown in FIG. 1 may include a substrate 110, a first electrode 120, a conductive adhesive layer 130, a second electrode 140, and at least one semiconductor light emitting element 150, as shown in FIG. 2.

The substrate 110 may be a flexible substrate. For example, to implement a flexible display device, the substrate 110 may include glass or polyimide (PI). Any insulative and flexible material such as polyethylene naphthalate (PEN) or polyethylene terephthalate (PET) may be employed. In addition, the substrate 110 may be formed of either a transparent material or an opaque material.

The substrate 110 may be a wiring substrate on which the first electrode 120 is disposed. Thus, the first electrode 120 may be positioned on the substrate 110.

As shown in FIG. 3A, an insulating layer 160 may be disposed on the substrate 110 on which the first electrode 120 is positioned, and an auxiliary electrode 170 may be positioned on the insulating layer 160. In this case, a stack in which the insulating layer 160 is laminated on the substrate 110 may be a single wiring substrate. More specifically, the insulating layer 160 may be formed of an insulative and flexible material such as PI, PET, or PEN, and may be integrated with the substrate 110 to form a single substrate.

The auxiliary electrode 170, which is an electrode that electrically connects the first electrode 120 and the semiconductor light emitting element 150, is positioned on the insulating layer 160, and is disposed to correspond to the position of the first electrode 120. For example, the auxiliary electrode 170 may have a dot shape and may be electrically connected to the first electrode 120 by an electrode hole 171 formed through the insulating layer 160. The electrode hole 171 may be formed by filling a via hole with a conductive material.

As shown in FIG. 2 or 3A, a conductive adhesive layer 130 may be formed on one surface of the insulating layer 160, but embodiments of the present disclosure are not limited thereto. For example, a layer performing a specific function may be formed between the insulating layer 160 and the conductive adhesive layer 130, or the conductive adhesive layer 130 may be disposed on the substrate 110 without the insulating layer 160. In a structure in which the conductive adhesive layer 130 is disposed on the substrate 110, the conductive adhesive layer 130 may serve as an insulating layer.

The conductive adhesive layer 130 may be a layer having adhesiveness and conductivity. For this purpose, a material having conductivity and a material having adhesiveness may be mixed in the conductive adhesive layer 130. In addition, the conductive adhesive layer 130 may have ductility, thereby providing making the display device flexible.

As an example, the conductive adhesive layer 130 may be an anisotropic conductive film (ACF), an anisotropic conductive paste, a solution containing conductive particles, or the like. The conductive adhesive layer 130 may be configured as a layer that allows electrical interconnection in the direction of the Z-axis extending through the thickness, but is electrically insulative in the horizontal X-Y direction. Accordingly, the conductive adhesive layer 130 may be referred to as a Z-axis conductive layer (hereinafter, referred to simply as a "conductive adhesive layer").

The ACF is a film in which an anisotropic conductive medium is mixed with an insulating base member. When the ACF is subjected to heat and pressure, only a specific portion thereof becomes conductive by the anisotropic conductive medium. Hereinafter, it will be described that heat and pressure are applied to the ACF. However, another method may be used to make the ACF partially conductive. The other method may be, for example, application of only one of the heat and pressure or UV curing.

In addition, the anisotropic conductive medium may be, for example, conductive balls or conductive particles. For example, the ACF may be a film in which conductive balls are mixed with an insulating base member. Thus, when heat and pressure are applied to the ACF, only a specific portion of the ACF is allowed to be conductive by the conductive balls. The ACF may contain a plurality of particles formed by coating the core of a conductive material with an insulating film made of a polymer material. In this case, as the insulating film is destroyed in a portion to which heat and pressure are applied, the portion is made to be conductive by the core. At this time, the cores may be deformed to form layers that contact each other in the thickness direction of the film. As a more specific example, heat and pressure are applied to the whole ACF, and an electrical connection in the Z-axis direction is partially formed by the height difference of a counterpart adhered by the ACF.

As another example, the ACF may contain a plurality of particles formed by coating an insulating core with a conductive material. In this case, as the conductive material is deformed (pressed) in a portion to which heat and pressure are applied, the portion is made to be conductive in the thickness direction of the film. As another example, the conductive material may be disposed through the insulating base member in the Z-axis direction to provide conductivity in the thickness direction of the film. In this case, the conductive material may have a pointed end.

The ACF may be a fixed array ACF in which conductive balls are inserted into one surface of the insulating base member. More specifically, the insulating base member may be formed of an adhesive material, and the conductive balls may be intensively disposed on the bottom portion of the insulating base member. Thus, when the base member is subjected to heat and pressure, it may be deformed together with the conductive balls, exhibiting conductivity in the vertical direction.

However, the present disclosure is not necessarily limited thereto, and the ACF may be formed by randomly mixing conductive balls in the insulating base member, or may be composed of a plurality of layers with conductive balls arranged on one of the layers (as a double-ACF).

The anisotropic conductive paste may be a combination of a paste and conductive balls, and may be a paste in which conductive balls are mixed with an insulating and adhesive base material. Also, the solution containing conductive particles may be a solution containing any conductive particles or nanoparticles.

Referring back to FIG. 3A, the second electrode 140 is positioned on the insulating layer 160 and spaced apart from the auxiliary electrode 170. That is, the conductive adhesive layer 130 is disposed on the insulating layer 160 having the auxiliary electrode 170 and the second electrode 140 positioned thereon.

After the conductive adhesive layer 130 is formed with the auxiliary electrode 170 and the second electrode 140 positioned on the insulating layer 160, the semiconductor light emitting element 150 is connected thereto in a flip-chip form by applying heat and pressure. Thereby, the semiconductor light emitting element 150 is electrically connected to the first electrode 120 and the second electrode 140.

Referring to FIG. 4, the semiconductor light emitting element may be a flip chip-type light emitting device.

For example, the semiconductor light emitting element may include a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 disposed on the n-type semiconductor layer 153 and horizontally spaced apart from the p-type electrode 156. In this case, the p-type electrode 156 may be electrically connected to the auxiliary electrode 170, which is shown in FIG. 3, by the conductive adhesive layer 130, and the n-type electrode 152 may be electrically connected to the second electrode 140.

Referring back to FIGS. 2, 3A and 3B, the auxiliary electrode 170 may be elongated in one direction. Thus, one auxiliary electrode may be electrically connected to the plurality of semiconductor light emitting elements 150. For example, p-type electrodes of semiconductor light emitting elements on left and right sides of an auxiliary electrode may be electrically connected to one auxiliary electrode.

More specifically, the semiconductor light emitting element 150 may be press-fitted into the conductive adhesive layer 130 by heat and pressure. Thereby, only the portions of the semiconductor light emitting element 150 between the p-type electrode 156 and the auxiliary electrode 170 and between the n-type electrode 152 and the second electrode 140 may exhibit conductivity, and the other portions of the semiconductor light emitting element 150 do not exhibit conductivity as they are not press-fitted. In this way, the conductive adhesive layer 130 interconnects and electrically connects the semiconductor light emitting element 150 and the auxiliary electrode 170 and interconnects and electrically connects the semiconductor light emitting element 150 and the second electrode 140.

The plurality of semiconductor light emitting elements 150 may constitute a light emitting device array, and a phosphor conversion layer 180 may be formed on the light emitting device array.

The light emitting device array may include a plurality of semiconductor light emitting elements having different luminance values. Each semiconductor light emitting element 150 may constitute a unit pixel and may be electrically connected to the first electrode 120. For example, a plurality of first electrodes 120 may be provided, and the semiconductor light emitting elements may be arranged in, for example, several columns. The semiconductor light emitting elements in each column may be electrically connected to any one of the plurality of first electrodes.

In addition, since the semiconductor light emitting elements are connected in a flip-chip form, semiconductor light emitting elements grown on a transparent dielectric substrate may be used. The semiconductor light emitting elements may be, for example, nitride semiconductor light emitting elements. Since the semiconductor light emitting element 150 has excellent luminance, it may constitute an individual unit pixel even when it has a small size.

As shown in FIG. 3, a partition wall 190 may be formed between the semiconductor light emitting elements 150. In this case, the partition wall 190 may serve to separate individual unit pixels from each other, and may be integrated with the conductive adhesive layer 130. For example, by inserting the semiconductor light emitting element 150 into the ACF, the base member of the ACF may form the partition wall.

In addition, when the base member of the ACF is black, the partition wall 190 may have reflectance and increase contrast even without a separate black insulator.

As another example, a reflective partition wall may be separately provided as the partition wall 190. In this case, the partition wall 190 may include a black or white insulator depending on the purpose of the display device. When a partition wall including a white insulator is used, reflectivity may be increased. When a partition wall including a black insulator is used, it may have reflectance and increase contrast.

The phosphor conversion layer 180 may be positioned on the outer surface of the semiconductor light emitting element 150. For example, the semiconductor light emitting element 150 may be a blue semiconductor light emitting element that emits blue (B) light, and the phosphor conversion layer 180 may function to convert the blue (B) light into a color of a unit pixel. The phosphor conversion layer 180 may be a red phosphor 181 or a green phosphor 182 constituting an individual pixel.

That is, the red phosphor 181 capable of converting blue light into red (R) light may be laminated on a blue semiconductor light emitting element at a position of a unit pixel of red color, and the green phosphor 182 capable of converting blue light into green (G) light may be laminated on the blue semiconductor light emitting element at a position of a unit pixel of green color. Only the blue semiconductor light emitting element may be used alone in the portion constituting the unit pixel of blue color. In this case, unit pixels of red (R), green (G), and blue (B) may constitute one pixel. More specifically, a phosphor of one color may be laminated along each line of the first electrode 120. Accordingly, one line on the first electrode 120 may be an electrode for controlling one color. That is, red (R), green (G), and blue (B) may be sequentially disposed along the second electrode 140, thereby implementing a unit pixel.

However, embodiments of the present disclosure are not limited thereto. Unit pixels of red (R), green (G), and blue (B) may be implemented by combining the semiconductor light emitting element 150 and the quantum dot (QD) rather than using the phosphor.

Also, a black matrix 191 may be disposed between the phosphor conversion layers to improve contrast. That is, the black matrix 191 may improve contrast of light and darkness.

However, embodiments of the present disclosure are not limited thereto, and anther structure may be applied to implement blue, red, and green colors.

FIGS. 5A to 5C are conceptual diagrams illustrating various examples of color implementation with respect to a flip-chip type semiconductor light emitting element.

Referring to FIG. 5A, each semiconductor light emitting element may be implemented as a high-power light emitting device emitting light of various colors including blue by using gallium nitride (GaN) as a main material and adding indium (In) and/or aluminum (Al).

In this case, each semiconductor light emitting element may be a red, green, or blue semiconductor light emitting element to form a unit pixel (sub-pixel). For example, red, green, and blue semiconductor light emitting elements R, G, and B may be alternately disposed, and unit pixels of red, green, and blue may constitute one pixel by the red, green and blue semiconductor light emitting elements. Thereby, a full-color display may be implemented.

Referring to FIG. 5B, the semiconductor light emitting element 150a may include a white light emitting device W having a yellow phosphor conversion layer, which is provided for each device. In this case, in order to form a unit pixel, a red phosphor conversion layer 181, a green phosphor conversion layer 182, and a blue phosphor conversion layer 183 may be disposed on the white light emitting device W. In addition, a unit pixel may be formed using a color filter repeating red, green, and blue on the white light emitting device W.

Referring to FIG. 5C, a red phosphor conversion layer 181, a green phosphor conversion layer 185, and a blue phosphor conversion layer 183 may be provided on a ultraviolet light emitting device. Not only visible light but also ultraviolet (UV) light may be used in the entire region of the semiconductor light emitting element. In an embodiment, UV may be used as an excitation source of the upper phosphor in the semiconductor light emitting element.

Referring back to this example, the semiconductor light emitting element is positioned on the conductive adhesive layer to constitute a unit pixel in the display device. Since the semiconductor light emitting element has excellent luminance, individual unit pixels may be configured despite even when the semiconductor light emitting element has a small size.

Regarding the size of such an individual semiconductor light emitting element, the length of each side of the device may be, for example, 80 µm or less, and the device may have a rectangular or square shape. When the semiconductor light emitting element has a rectangular shape, the size thereof may be less than or equal to 20 µm×80 µm.

In addition, even when a square semiconductor light emitting element having a side length of 10 µm is used as a unit pixel, sufficient brightness to form a display device may be obtained.

Therefore, for example, in case of a rectangular pixel having a unit pixel size of 600 µm×300 µm (i.e., one side by the other side), a distance of a semiconductor light emitting element becomes sufficiently long relatively.

Thus, in this case, it is able to implement a flexible display device having high image quality over HD image quality.

The above-described display device using the semiconductor light emitting element may be prepared by a new fabricating method. Such a fabricating method will be described with reference to FIG. 6 as follows.

Figure 6:
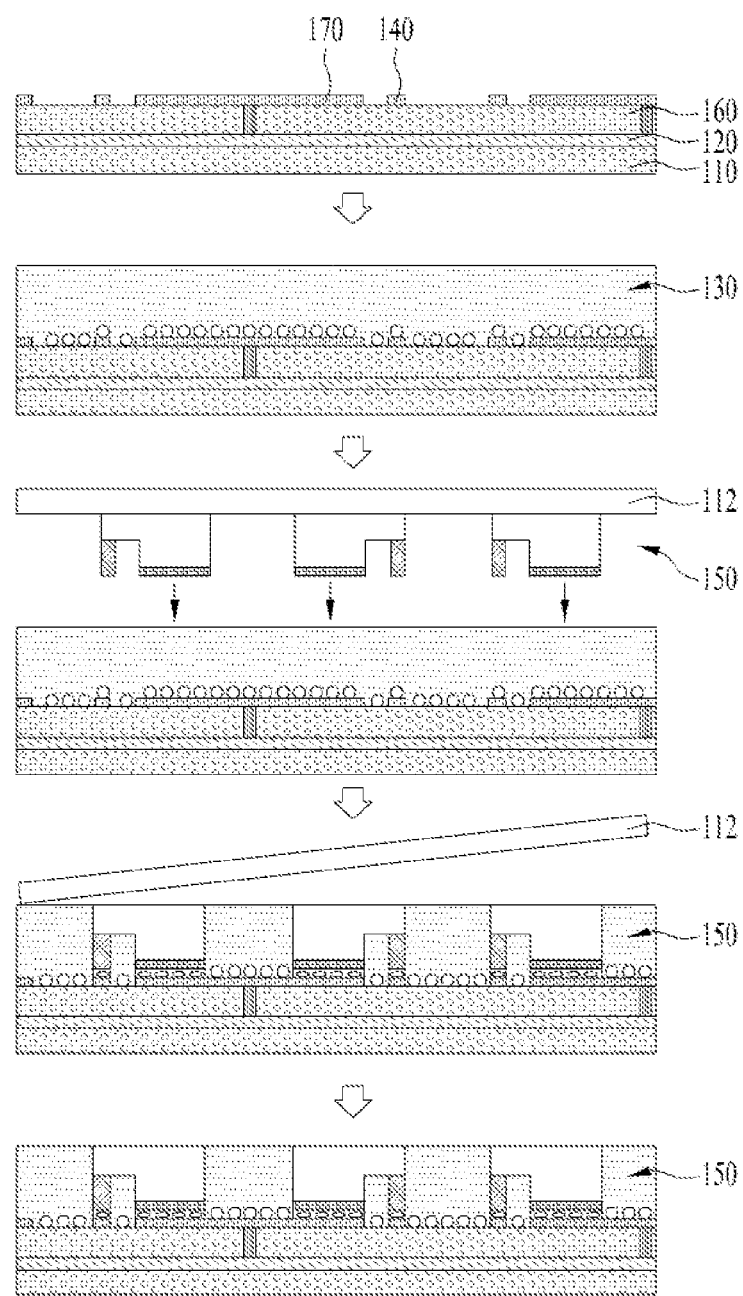
FIG. 6 shows cross-sectional views of a method of fabricating a display device using a semiconductor light emitting element according to the present disclosure.

FIG. 6 shows cross-sectional views of a method of fabricating a display device using a semiconductor light emitting element according to the present disclosure.

Referring to FIG. 6, first of all, a conductive adhesive layer 130 is formed on an insulating layer 160 located between an auxiliary electrode 170 and a second electrode 140. The insulating layer 160 is tacked on a wiring substrate 110. On the wiring substrate 110, a first electrode 120, the auxiliary electrode 170 and the second electrode 140 are disposed. In this case, the first electrode 120 and the second electrode 140 may be disposed in mutually orthogonal directions, respectively. In order to implement a flexible display device, the wiring substrate 110 and the insulating layer 160 may include glass or polyimide (PI) each.

For example, the conductive adhesive layer 130 may be implemented by an anisotropic conductive film. To this end, an anisotropic conductive film may be coated on the substrate on which the insulating layer 160 is located.

Subsequently, a temporary substrate 112, on which a plurality of semiconductor light emitting elements 150 configuring individual pixels are located to correspond to locations of the auxiliary electrode 170 and the second electrodes 140, is disposed in a manner that the semiconductor light emitting element 150 confronts the auxiliary electrode 170 and the second electrode 140.

In this regard, the temporary 112 substrate 112 is a growing substrate for growing the semiconductor light emitting element 150 and may include a sapphire or silicon substrate.

The semiconductor light emitting element is configured to have a space and size for configuring a display device when formed in unit of wafer, thereby being effectively used for the display device.

Subsequently, the wiring substrate 110 and the temporary substrate 112 are thermally compressed together. By the thermocompression, the wiring substrate 110 and the temporary substrate 112 are bonded together. Owing to the property of an anisotropic conductive film having conductivity by thermocompression, only a portion among the semiconductor light emitting element 150, the auxiliary electrode 170 and the second electrode 140 has conductivity, via which the electrodes and the semiconductor light emitting element 150 may be connected electrically. In this case, the semiconductor light emitting element 150 is inserted into the anisotropic conductive film, by which a partition may be formed between the semiconductor light emitting elements 150.

Then the temporary substrate 112 is removed. For example, the temporary substrate 112 may be removed using Laser Lift-Off (LLO) or Chemical Lift-Off (CLO).

Finally, by removing the temporary substrate 112, the semiconductor light emitting elements 150 exposed externally. If necessary, the wiring substrate 110 to which the semiconductor light emitting elements 150 are coupled may be coated with silicon oxide (SiOx) or the like to form a transparent insulating layer (not shown).

In addition, a step of forming a phosphor layer on one side of the semiconductor light emitting element 150 may be further included. For example, the semiconductor light emitting element 150 may include a blue semiconductor light emitting element emitting Blue (B) light, and a red or green phosphor for converting the blue (B) light into a color of a unit pixel may form a layer on one side of the blue semiconductor light emitting element.

The above-described fabricating method or structure of the display device using the semiconductor light emitting element may be modified into various forms. For example, the above-described display device may employ a vertical semiconductor light emitting element.

Furthermore, a modification or embodiment described in the following may use the same or similar reference numbers for the same or similar configurations of the former example and the former description may apply thereto.

Figure 7:
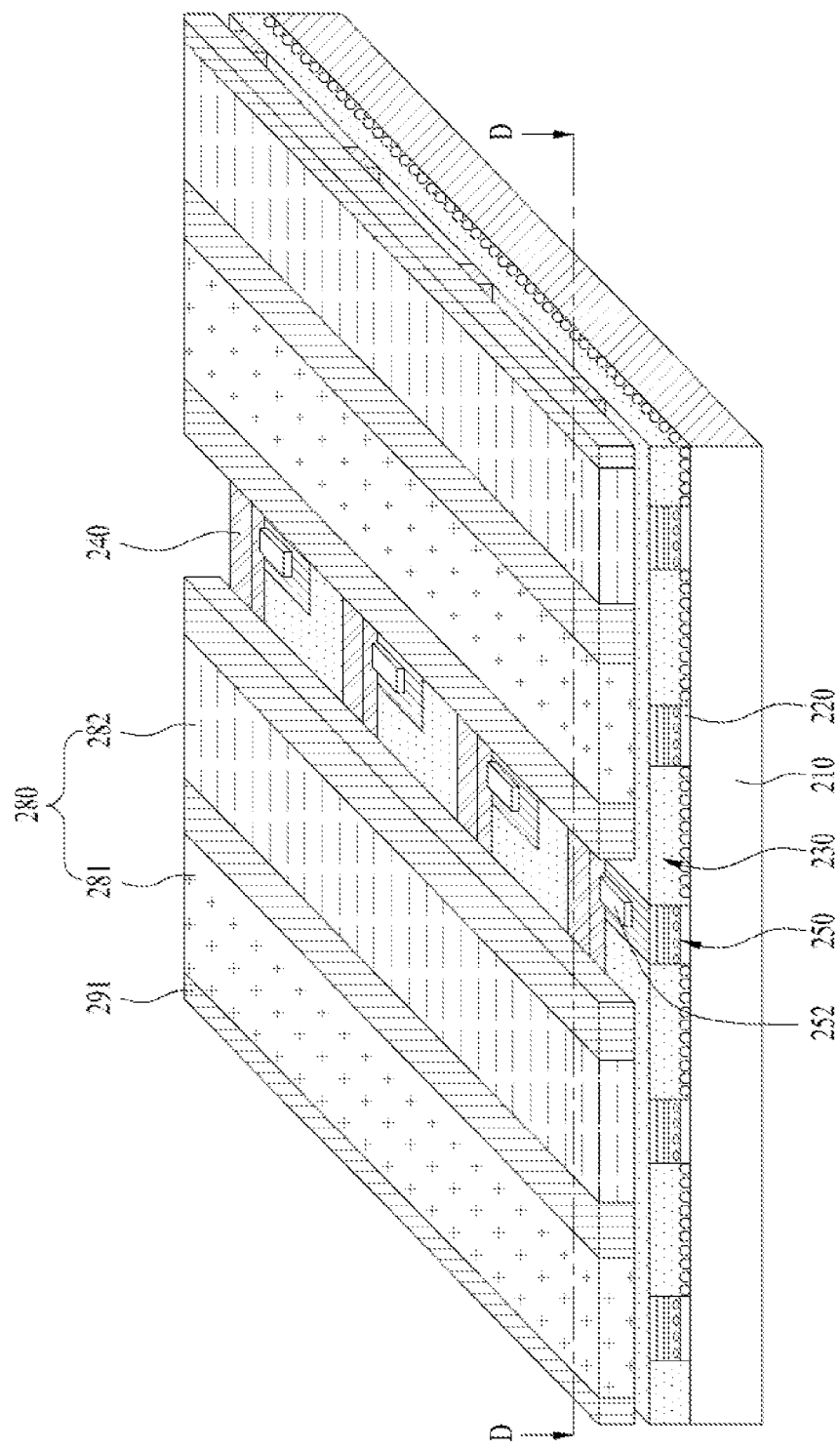
FIG. 7 is a perspective diagram of a display device using a semiconductor light emitting element according to another embodiment of the present disclosure.
Figure 8:
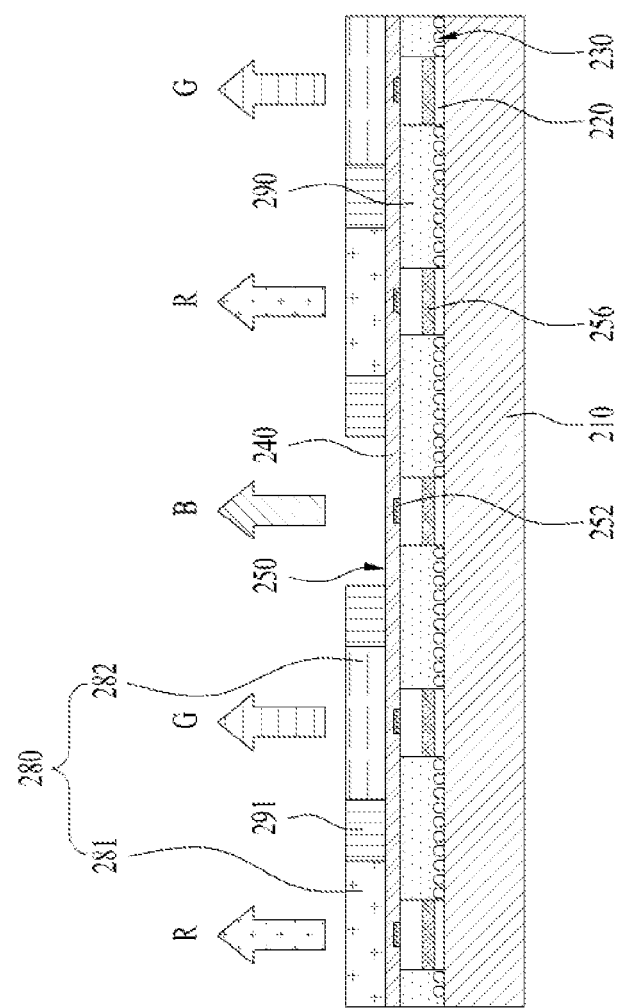
FIG. 8 is a cross-sectional diagram taken along a cutting line D-D shown in FIG. 8.
Figure 9:
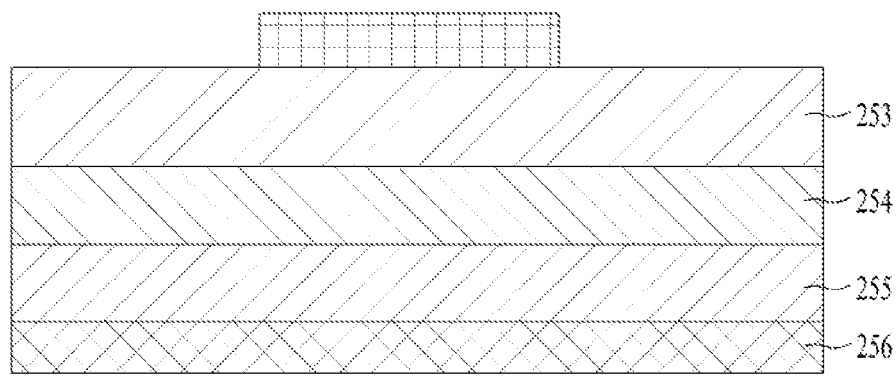
FIG. 9 is a conceptual diagram showing a vertical type semiconductor light emitting element shown in FIG. 8.

FIG. 7 is a perspective diagram of a display device using a semiconductor light emitting element according to another embodiment of the present disclosure, FIG. 8 is a cross-sectional diagram taken along a cutting line D-D shown in FIG. 8, and FIG. 9 is a conceptual diagram showing a vertical type semiconductor light emitting element shown in FIG. 8.

Referring to the present drawings, a display device may employ a vertical semiconductor light emitting device of a Passive Matrix (PM) type.

The display device includes a substrate 210, a first electrode 220, a conductive adhesive layer 230, a second electrode 240 and at least one semiconductor light emitting element 250.

The substrate 210 is a wiring substrate on which the first electrode 220 is disposed and may contain polyimide (PI) to implement a flexible display device. Besides, the substrate 210 may use any substance that is insulating and flexible.

The first electrode 210 is located on the substrate 210 and may be formed as a bar type electrode that is long in one direction. The first electrode 220 may be configured to play a role as a data electrode.

The conductive adhesive layer 230 is formed on the substrate 210 where the first electrode 220 is located. Like a display device to which a light emitting device of a flip chip type is applied, the conductive adhesive layer 230 may include one of an Anisotropic Conductive Film (ACF), an anisotropic conductive paste, a conductive particle contained solution and the like. Yet, in the present embodiment, a case of implementing the conductive adhesive layer 230 with the anisotropic conductive film is exemplified.

After the conductive adhesive layer has been placed in the state that the first electrode 220 is located on the substrate 210, if the semiconductor light emitting element 250 is connected by applying heat and pressure thereto, the semiconductor light emitting element 250 is electrically connected to the first electrode 220. In doing so, the semiconductor light emitting element 250 is preferably disposed to be located on the first electrode 220.

If heat and pressure is applied to an anisotropic conductive film, as described above, since the anisotropic conductive film has conductivity partially in a thickness direction, the electrical connection is established. Therefore, the anisotropic conductive film is partitioned into a conductive portion and a non-conductive portion.

Furthermore, since the anisotropic conductive film contains an adhesive component, the conductive adhesive layer 230 implements mechanical coupling between the semiconductor light emitting element 250 and the first electrode 220 as well as mechanical connection.

Thus, the semiconductor light emitting element 250 is located on the conductive adhesive layer 230, via which an individual pixel is configured in the display device. As the semiconductor light emitting element 250 has excellent luminance, an individual unit pixel may be configured in small size as well. Regarding a size of the individual semiconductor light emitting element 250, a length of one side may be equal to or smaller than 80 µm for example and the individual semiconductor light emitting element 250 may include a rectangular or square element. For example, the rectangular element may have a size equal to or smaller than 20 µm×80 µm.

The semiconductor light emitting element 250 may have a vertical structure.

Among the vertical type semiconductor light emitting elements, a plurality of second electrodes 240 respectively and electrically connected to the vertical type semiconductor light emitting elements 250 are located in a manner of being disposed in a direction crossing with a length direction of the first electrode 220.

Referring to FIG. 9, the vertical type semiconductor light emitting element 250 includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on then-type semiconductor layer 253. In this case, the p-type electrode 256 located on a bottom side may be electrically connected to the first electrode 220 by the conductive adhesive layer 230, and the n-type electrode 252 located on a top side may be electrically connected to a second electrode 240 described later. Since such a vertical type semiconductor light emitting element 250 can dispose the electrodes at top and bottom, it is considerably advantageous in reducing a chip size.

Referring to FIG. 8 again, a phosphor layer 280 may formed on one side of the semiconductor light emitting element 250. For example, the semiconductor light emitting element 250 may include a blue semiconductor light emitting element 251 emitting blue (B) light, and a phosphor layer 280 for converting the blue (B) light into a color of a unit pixel may be provided. In this regard, the phosphor layer 280 may include a red phosphor 281 and a green phosphor 282 configuring an individual pixel.

Namely, at a location of configuring a red unit pixel, the red phosphor 281 capable of converting blue light into red (R) light may be stacked on a blue semiconductor light emitting element. At a location of configuring a green unit pixel, the green phosphor 282 capable of converting blue light into green (G) light may be stacked on the blue semiconductor light emitting element. Moreover, the blue semiconductor light emitting element may be singly usable for a portion that configures a blue unit pixel. In this case, the unit pixels of red (R), green (G) and blue (B) may configure a single pixel.

Yet, the present disclosure is non-limited by the above description. In a display device to which a light emitting element of a flip chip type is applied, as described above, a different structure for implementing blue, red and green may be applicable.

Regarding the present embodiment again, the second electrode 240 is located between the semiconductor light emitting elements 250 and connected to the semiconductor light emitting elements electrically. For example, the semiconductor light emitting elements 250 are disposed in a plurality of columns, and the second electrode 240 may be located between the columns of the semiconductor light emitting elements 250.

Since a distance between the semiconductor light emitting elements 250 configuring the individual pixel is sufficiently long, the second electrode 240 may be located between the semiconductor light emitting elements 250.

The second electrode 240 may be formed as an electrode of a bar type that is long in one direction and disposed in a direction vertical to the first electrode.

In addition, the second electrode 240 and the semiconductor light emitting element 250 may be electrically connected to each other by a connecting electrode protruding from the second electrode 240. Particularly, the connecting electrode may include a n-type electrode of the semiconductor light emitting element 250. For example, the n-type electrode is formed as an ohmic electrode for ohmic contact, and the second electrode covers at least one portion of the ohmic electrode by printing or deposition. Thus, the second electrode 240 and the n-type electrode of the semiconductor light emitting element 250 may be electrically connected to each other.

Referring to FIG. 8 again, the second electrode 240 may be located on the conductive adhesive layer 230. In some cases, a transparent insulating layer (not shown) containing silicon oxide (SiOx) and the like may be formed on the substrate 210 having the semiconductor light emitting element 250 formed thereon. If the second electrode 240 is placed after the transparent insulating layer has been formed, the second electrode 240 is located on the transparent insulating layer. Alternatively, the second electrode 240 may be formed in a manner of being spaced apart from the conductive adhesive layer 230 or the transparent insulating layer.

If a transparent electrode of Indium Tin Oxide (ITO) or the like is sued to place the second electrode 240 on the semiconductor light emitting element 250, there is a problem that ITO substance has poor adhesiveness to an n-type semiconductor layer. Therefore, according to the present disclosure, as the second electrode 240 is placed between the semiconductor light emitting elements 250, it is advantageous in that a transparent electrode of ITO is not used. Thus, light extraction efficiency can be improved using a conductive substance having good adhesiveness to an n-type semiconductor layer as a horizontal electrode without restriction on transparent substance selection.

Referring to FIG. 8 again, a partition 290 may be located between the semiconductor light emitting elements 250. Namely, in order to isolate the semiconductor light emitting element 250 configuring the individual pixel, the partition 290 may be disposed between the vertical type semiconductor light emitting elements 250. In this case, the partition 290 may play a role in separating the individual unit pixels from each other and be formed with the conductive adhesive layer 230 as an integral part. For example, by inserting the semiconductor light emitting element 250 in an anisotropic conductive film, a base member of the anisotropic conductive film may form the partition.

In addition, if the base member of the anisotropic conductive film is black, the partition 290 may have reflective property as well as a contrast ratio may be increased, without a separate block insulator.

For another example, a reflective partition may be separately provided as the partition 190. The partition 290 may include a black or white insulator depending on the purpose of the display device.

In case that the second electrode 240 is located right onto the conductive adhesive layer 230 between the semiconductor light emitting elements 250, the partition 290 may be located between the vertical type semiconductor light emitting element 250 and the second electrode 240 each. Therefore, an individual unit pixel may be configured using the semiconductor light emitting element 250. Since a distance between the semiconductor light emitting elements 250 is sufficiently long, the second electrode 240 can be placed between the semiconductor light emitting elements 250. And, it may bring an effect of implementing a flexible display device having HD image quality.

In addition, as shown in FIG. 8, a black matrix 291 may be disposed between the respective phosphors for the contrast ratio improvement. Namely, the black matrix 291 may improve the contrast between light and shade.

In the display device using the semiconductor light-emitting element of the present disclosure described above, the semiconductor light-emitting element grown on a wafer is placed on a wiring substrate in the flip-chip form and used as an individual pixel.

Figure 10:
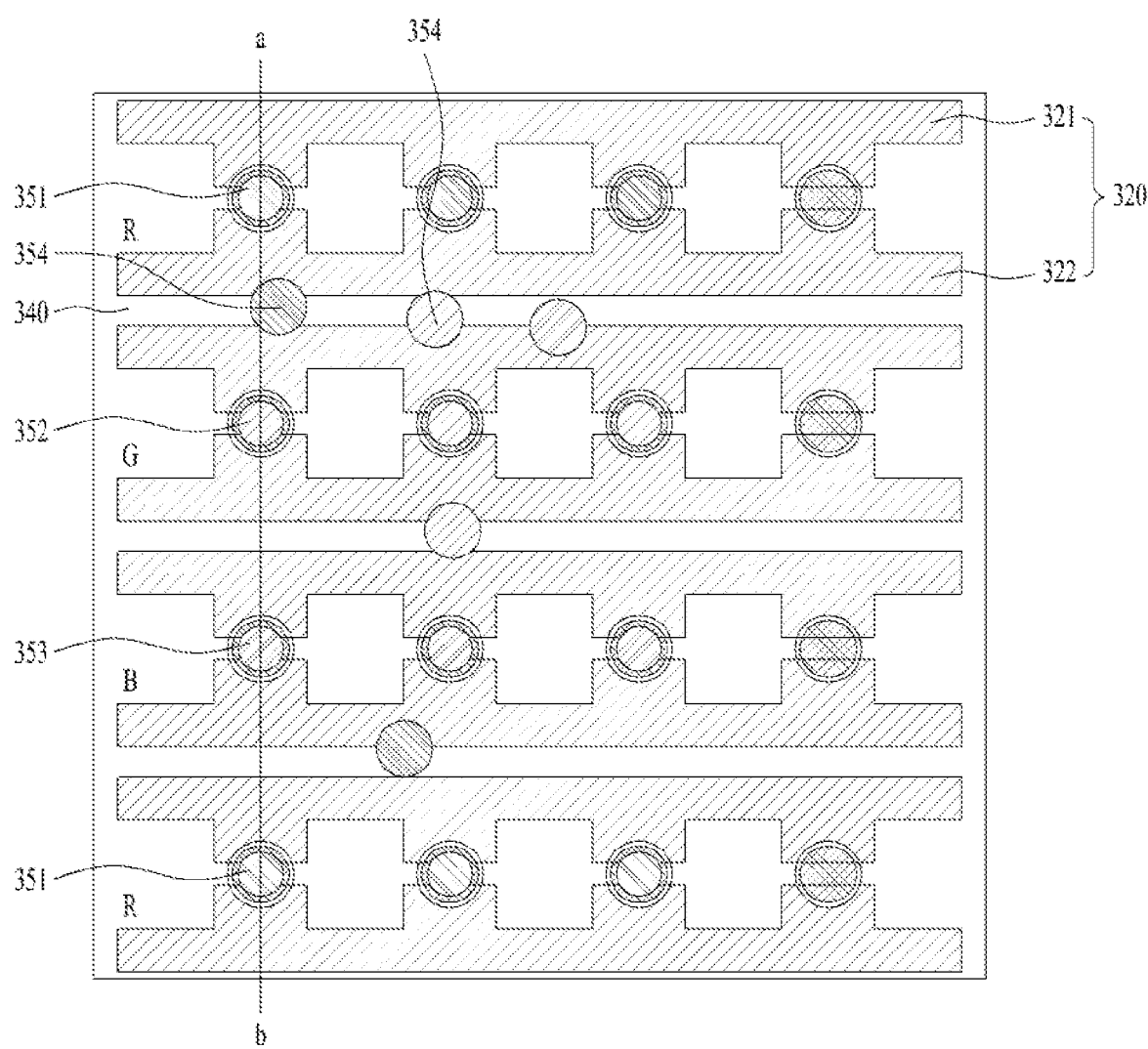
FIG. 10 is a schematic layout illustrating a display device using a semiconductor light emitting element to which the present disclosure is applicable.

FIG. 10 is a schematic layout illustrating a display device using a semiconductor light emitting element to which the present disclosure is applicable.

Figure 11:
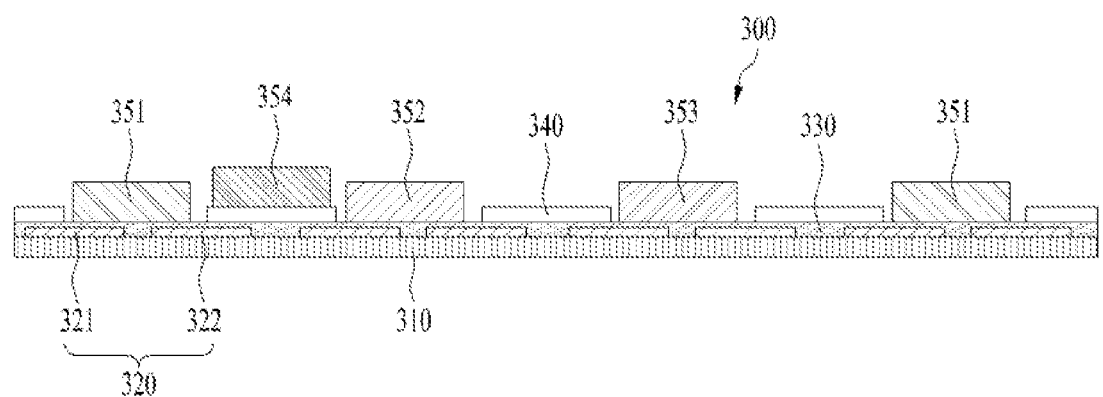
FIG. 11 is a cross-sectional diagram along a line a-b shown in FIG. 10.

FIG. 11 is a cross-sectional diagram along a line a-b shown in FIG. 10.

Referring to FIG. 10 and FIG. 11, a display device 300 using a semiconductor light emitting element may have a multitude assembly electrodes 320 located on a substrate 310. Such an assembly electrode 320 may be disposed on the substrate 310 in a manner that two electrodes 321 and 322 are paired with each other.

Red/Green/Blue (R/G/B) pixels may be repeatedly disposed on the substrate 310. Referring to FIG. 10, pixels in the same color may be located at regular intervals in a manner of being repeated in a horizontal direction.

Here, the assembly electrode 320 may be disposed to induce Dielectrophoresis (DEP) attributed to an electric field when semiconductor light emitting elements 351 to 353 configuring individual pixels are assembled.

In this case, the assembly electrode 320 may be used for self-assembly of the semiconductor light emitting elements 351 to 353. Here, the self-assembly may mean a process that a plurality of semiconductor light emitting elements 351 to 353 grown on a wafer are distributed in fluid by being separated into individual elements and are then assembled on the substrate using an electromagnetic field.

Thus, by Dielectrophoresis (DEP) induced by the assembly electrode 320, the semiconductor light emitting elements 351 to 353 configuring the individual pixels may be temporarily fixed to pixel areas, respectively.

On the assembly electrode 320, an insulating layer 330 covering the assembly electrode 320 to insulate may be located.

In addition, on the insulating layer 330, a partition wall 340 for limiting (or defining) an individual pixel area may be formed. Namely, referring to FIG. 11, the partition wall 340 may be formed around the location at which the semiconductor light emitting element 351/352/353 forming the individual pixel is installed. By the partition wall 340, a hall area (i.e., an assembly groove) in which the semiconductor light emitting element 351/352/353 is installed may be formed.

Therefore, the semiconductor light emitting element 351/352/353 may be self-assembled and installed in the hall area (assembly groove) formed by the partition wall 340.

Yet, in some cases, when the above-described semiconductor light emitting elements 351 to 353 are self-assembled, it may happen that the light emitting element is attached to a location other than the individual pixel area, i.e., the hall area. Namely, referring to FIG. 10 and FIG. 11, there may exist a light emitting element 354 attached to an area other than the hall area formed by the partition wall 340.

Particularly, as an inter-electrode distance for self-assembly is narrowed for the downsizing and high-resolution implementation of a Light Emitting Diode (LED) chip, such a phenomenon may increase more. Namely, as an inter-electrode distance and an inter-pixel distance are narrowed, interference of an electric field may occur in an adjacent pixel area. Hence, by the electric field interference, it may more frequently happen that the light emitting element 354 is attached to a substrate surface of an area other than the assembly groove.

Figure 12:
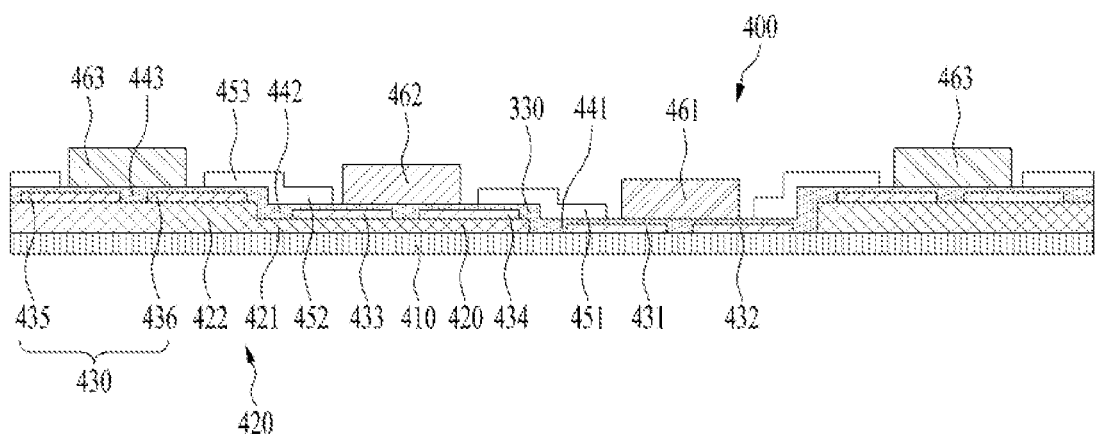
FIG. 12 is a schematic cross-sectional diagram showing a display device using a semiconductor light emitting element according to a first embodiment of the present disclosure.

FIG. 12 is a schematic cross-sectional diagram showing a display device using a semiconductor light emitting element according to a first embodiment of the present disclosure.

Referring to FIG. 12, a display device 400 using a semiconductor light emitting element according to the present embodiment may configure a height different per pixel.

Namely, a step difference layer 420 may be provided to at least some pixel areas among a multitude of individual pixel areas (assembly grooves). The step difference layer 420 may be provided to differentiate heights of adjacent pixel areas from each other. Namely, the heights of the assembly grooves in which the light emitting elements are installed may be differentiated from each other by the step difference layer 420.

The step difference layer 420 may include a first step difference layer 421 forming a pixel area at a first height and a second step difference layer 422 forming a pixel area at a second height higher than the first height.

Thus, the first step difference layer 421 and the second step difference layer 422 may differentiate heights of pixel areas adjacent to each other. Namely, by the first and second step difference layers 421 and 422, a light emitting element formed on the first step difference layer 421 may differ from a light emitting element formed on the second step difference layer 422 in height.

In addition, due to the difference layers, a bent area (step shape) may be formed in a space between individual pixel areas in which the light emitting elements are installed. The bent area (step shape) may provide a location at which it is difficult to install a light emitting element that forms an individual pixel. Namely, it may be difficult to self-assemble a light emitting element in the step shape between the individual pixel areas due to the step difference in height. In addition, interference of an electric field in each pixel area may not occur in the step shape between the individual pixel areas.

A multitude of pixel areas may include a red area, a green area and a blue area. Namely, a red light emitting element 463 may be installed in the red area, a green light emitting element 462 may be installed in the green area, and a blue light emitting element 461 may be installed in the blue area.

Thus, a multitude of the individual pixel areas may include the red area, the green area and the blue area, and an assembly side of one of the red, green and blue areas may differ from assembly sides of the rest of the two areas in height owing to the step difference layer 420.

In addition, the assembly sides of the areas neighboring each other among the red, green and blue areas may differ from each other in height.

In this case, the heights of the assembly sides of the red, green and blue areas may change sequentially.

Referring to FIG. 12, for example, the second step difference layer 422 may be located in the red area on the substrate 410, and the first step difference layer 421 may be located in the green area neighboring the red area. In this case, the second step difference layer 422 may be formed on the first step difference layer 421 (see FIG. 16). In addition, the step difference layer may not be formed in the blue area. In some cases, locations of the red, green and blue areas may be switched to one another.

A pair of the assembly electrodes may be located on the substrate 410, the first step difference layer 421 and the second step difference layer 422. For example, a pair of assembly electrodes 431 and 432 may be directly located on the substrate in the blue area, a pair of assembly electrodes 433 and 434 may be located on the first step difference layer 421, and a pair of assembly electrodes 435 and 436 may be located on the second step difference layer 422 in the blue area.

On the above assembly electrode 430, insulating layers 441, 442 and 443 covering the assembly electrode 430 may be located.

Owing to the above-described first and second step difference layers 421 and 422, the insulating layers 441 to 443 may differ from each other in height. Therefore, a step-shaped space may be formed in a neighboring portion of pixel areas, i.e., between the pixel areas by the insulating layers differing from each other in height.

On the insulating layer 441/442/443, a partition wall 451/452/453 defining an assembly groove in which a semiconductor light emitting element forming an individual pixel is mounted may be located.

In this case, the partition wall may include a first partition wall 451 in smallest height, a second partition wall 452 in height taller than that of the first partition wall 451, and a third partition wall 453 in height taller than that of the second partition wall 452.

In this case, the partition walls 451 to 453 may be provided to locations other than the respective assembly grooves, i.e., areas other than the locations at which the light emitting elements forming the individual pixels are installed, in a manner of forming step shapes.

For example, the first partition wall 451 and the second partition wall 452 may be located continuously with each other between the blue area and the green area, and the second partition wall 452 and the third partition wall 453 may be located continuously with each other between the green area and the red area.

Light emitting elements 461 to 463 may be installed in the assembly grooves formed by the partition walls 451 to 453, respectively. In this case, as described above, owing to the step shape formed by the step difference layer 420 in a manner of being extended to the partition walls 451 to 453, it may be less probable that the light emitting elements 461 to 463 are attached to an area other than the assembly grooves.

In addition, a pair of lightning electrodes 680 (see FIG. 33 and FIG. 34) electrically connected to each of the light emitting elements 461 to 463 may be provided.

A protective layer 670 (see FIG. 32 and FIG. 34) may be provided between the lighting electrode 680 and each of the light emitting elements 461 to 463. The protective layer 670 may planarize the height difference caused by the step difference layers 421 and 422.

Thus, since the height difference between the pixel areas can prevent the interference effect caused by an electric field between the pixel areas, a light emitting element is prevented from being attached to a substrate surface other than an assembly groove.

Moreover, although such a height difference is not significant, i.e., although there exists a partially interfering electric field, since a surface between pixel areas is not flat (i.e., step shape), ab effect of a magnetic force becomes greater than that of the interfering electric field, a chip may be dragged and attached to an assembly groove in the course of a self-assembly process.

Figure 13:
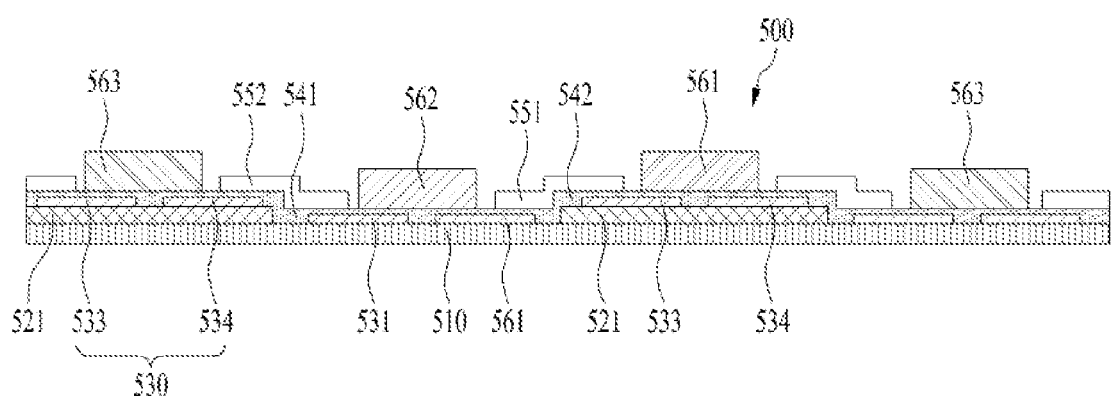
FIG. 13 is a schematic cross-sectional diagram showing a display device using a semiconductor light emitting element according to a second embodiment of the present disclosure.

FIG. 13 is a schematic cross-sectional diagram showing a display device using a semiconductor light emitting element according to a second embodiment of the present disclosure.

Referring to FIG. 13, a display device 500 using a semiconductor light emitting element according to the present embodiment may configure a height different per pixel.

Namely, a step difference layer 521 may be provided to at least some pixel areas among a multitude of individual pixel areas (assembly grooves). The step difference layer 521 may be provided to differentiate heights of adjacent pixel areas from each other. Namely, the heights of the assembly grooves in which the light emitting elements are installed may be differentiated from each other by the step difference layer 521.

The step difference layer 521 may be located alternately in pixel areas. For example, as shown in FIG. 13, the step difference layer 521 may exist in a blue area but may not exist in a green area neighboring the blue area. In addition, the step difference layer 521 may exist in a red area neighboring the green area.

Thus, the step difference layer 521 may differentiate heights of pixel areas neighboring each other. Namely, owing to the step difference layer 521, a height of a light emitting element installed in an assembly groove may be different from that of a light emitting element installed on a neighboring assembly groove.

In addition, due to the difference layers, a bent area (step shape) may be formed in a space between individual pixel areas in which the light emitting elements are installed. The bent area (step shape) may provide a location at which it is difficult to install a light emitting element that forms an individual pixel. Namely, it may be difficult to self-assemble a light emitting element in the step shape between the individual pixel areas due to the step difference in height. In addition, interference of an electric field in each pixel area may not occur in the step shape between the individual pixel areas.

A multitude of pixel areas may include a red area, a green area and a blue area. Namely, a red light emitting element 563 may be installed in the red area, a green light emitting element 562 may be installed in the green area, and a blue light emitting element 561 may be installed in the blue area.

Thus, a multitude of the individual pixel areas may include the red area, the green area and the blue area, and an assembly side of one of the red, green and blue areas may differ from assembly sides of the rest of the two areas in height owing to the step difference layer 521. Namely, assembly sides may be formed alternately in a manner of having different heights, respectively.

In addition, the assembly sides of neighboring areas among the red, green and blue areas may differ from each other in height.

Referring to FIG. 13, the step difference layer 521 may be located in the red area and the blue area on the substrate 510 but the step difference layer 521 may not be located in the green area located between the red area and the blue area. In addition, the step difference layer 521 may not be located in the red area located outside the blue area. Thus, the step difference layer 521 may be alternately located in each of the pixel areas. In some cases, locations of the red, green and blue areas may be switched to one another.

A pair of the assembly electrodes may be located on the substrate 510 and the step difference layer 521. For example, a pair of assembly electrodes 531 and 532 may be directly located on the substrate 510 in the green area and a pair of assembly electrodes 533 and 534 may be located on the step difference layer 521 in the red area and the blue area. In addition, a pair of assembly electrodes 531 and 532 may be directly located on the substrate 510 in the red area located outside the blue area.

On the above assembly electrode 530, insulating layers 541 and 542 covering the assembly electrode 530 may be located.

Owing to the above-described step difference layer 521, the insulating layers 541 and 541 may differ from each other in height. Therefore, a step-shaped space may be formed in a neighboring portion of pixel areas, i.e., between the pixel areas by the insulating layers differing from each other in height.

On the insulating layer 541/542, a partition wall 551/552 defining an assembly groove in which a semiconductor light emitting element forming an individual pixel is mounted may be located.

In this case, the partition wall may include a first partition wall 551 in smallest height and a second partition wall 552 in height taller than that of the first partition wall 551.

In this case, the partition walls 551 and 552 may be provided to locations other than the respective assembly grooves, i.e., areas other than the locations at which the light emitting elements forming the individual pixels are installed, in a manner of forming step shapes.

Light emitting elements 561 to 563 may be installed in the assembly grooves formed by the partition walls 551 and 552, respectively. In this case, as described above, owing to the step shape formed by the step difference layer 521 in a manner of being extended to the partition walls 551 and 552, it may be less probable that the light emitting elements 561 to 563 are attached to an area other than the assembly grooves.

In addition, a pair of lightning electrodes 660 (see FIG. 33 and FIG. 34) electrically connected to each of the light emitting elements 561 to 563 may be provided.

A protective layer 670 (see FIG. 32 and FIG. 34) may be provided between the lighting electrode 680 and each of the light emitting elements 561 to 563. The protective layer 670 may planarize the height difference caused by the step difference layers 521.

Thus, since the height difference between the pixel areas can prevent the interference effect caused by an electric field between the pixel areas, a light emitting element is prevented from being attached to a substrate surface other than an assembly groove.

Moreover, although such a height difference is not significant, i.e., although there exists a partially interfering electric field, since a surface between pixel areas is not flat (i.e., step shape), ab effect of a magnetic force becomes greater than that of the interfering electric field, a chip may be dragged and attached to an assembly groove in the course of a self-assembly process.

FIGS. 14 to 19 are schematic cross-sectional diagrams showing a process for fabricating a display device using a semiconductor light emitting element according to a first embodiment of the present disclosure.

Hereinafter, with reference to FIGS. 14 to 19, a process for fabricating a display device using a semiconductor light emitting element according to a first embodiment of the present disclosure will be described step by step.

Figure 14:
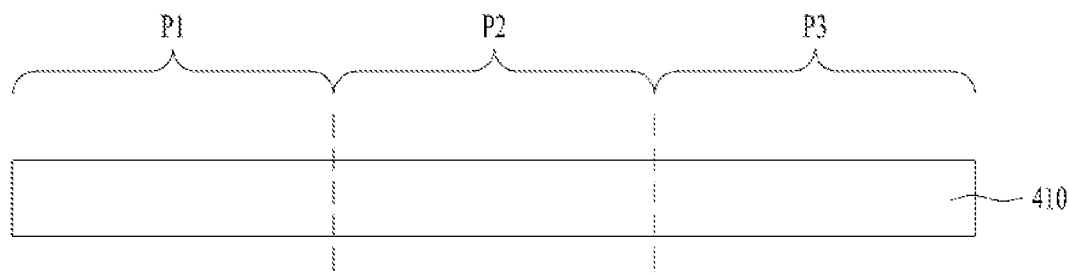
FIGS. 14 to 19 are schematic cross-sectional diagrams showing a process for fabricating a display device using a semiconductor light emitting element according to a first embodiment of the present disclosure.

Referring to FIG. 14, the following description will be made by taking an example that three pixel areas P1 to P3 are defined on a substrate 410. The three areas may correspond to a red area P1, a green area P2 and a blue area P3, respectively, by which the present disclosure is non-limited.

Figure 15:
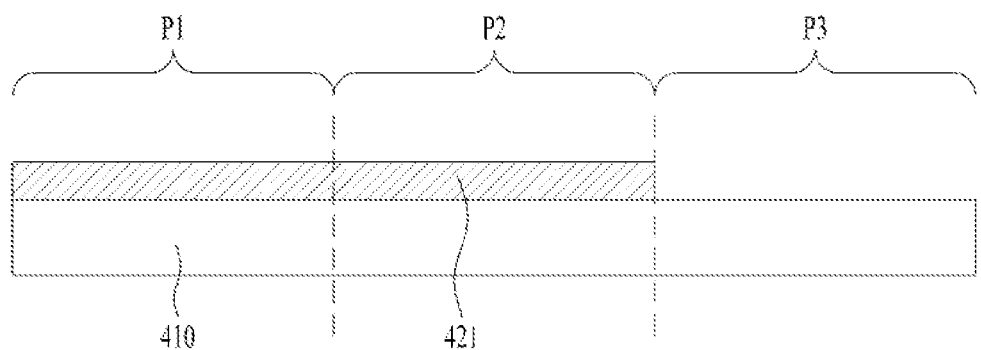
Figure 16:
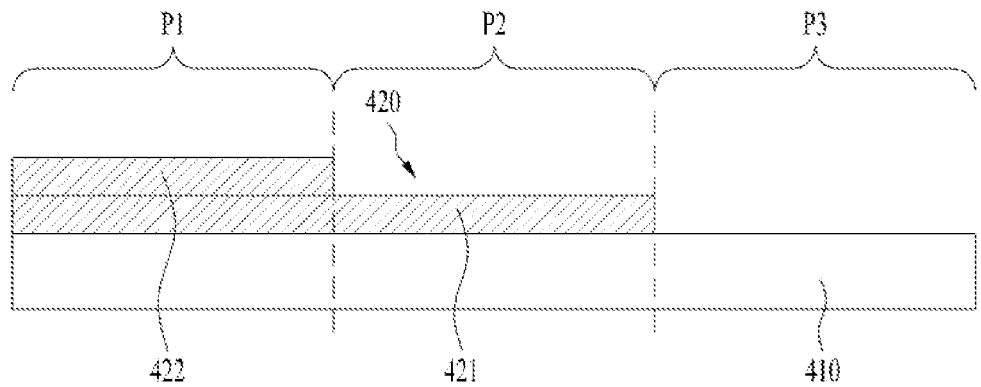

Referring to FIG. 15 and FIG. 16, a step difference layer 420 may be formed on the substrate 410. Specifically, referring to FIG. 15, a first step difference layer 421 may be formed on the substrate 410. As shown in the drawing, the first step difference layer 421 may be formed on two pixel areas Pa and P2 among the three pixel areas P1 to P3.

Subsequently, as shown in FIG. 16, a second step difference layer 422 may be formed on the first step difference layer 421. As shown in the drawing, the second step difference layer 422 may be formed on the red area P1 only. Hence, the red area P1, the green area P2 and the blue area P3 may be formed in a step shape to have sequential heights, respectively.

Figure 17:
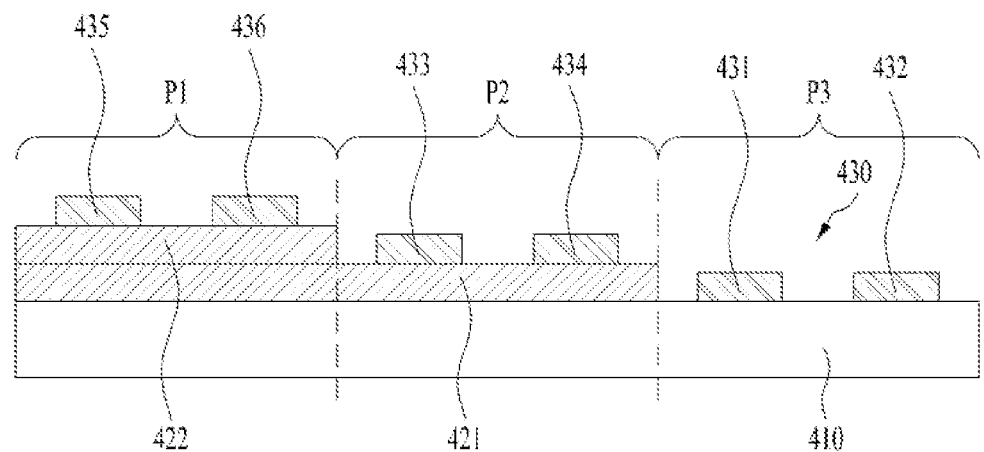

Referring to FIG. 17, an assembly electrode 430 may be formed on the substrate 410, the first step difference layer 421 and the second step difference layer 422.

Namely, a pair of assembly electrodes 431 and 432, a pair of assembly electrodes 433 and 434 and a pair of assembly electrodes 435 and 436 may be formed on the substrate 410, the first step difference layer 421 and the second step difference layer 422, respectively.

Figure 18:
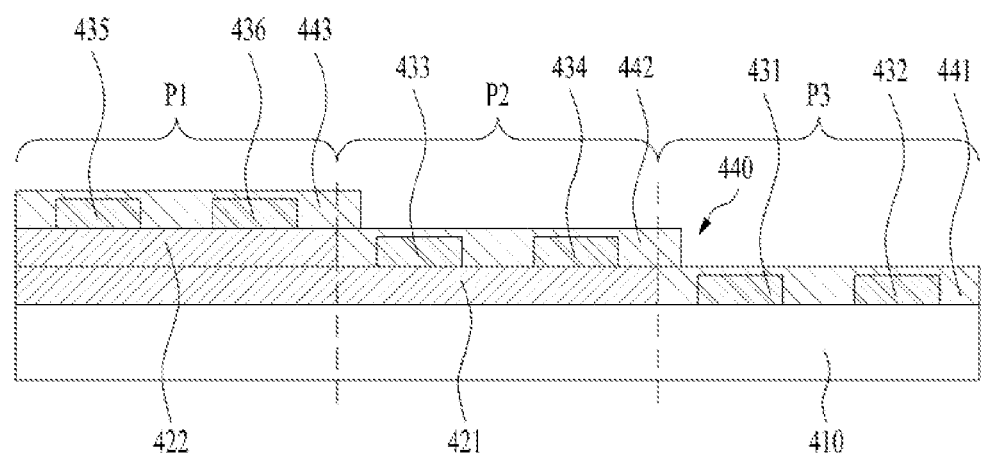

Referring to FIG. 18, an insulating layer 440 may be formed to cover the assembly electrodes 431/432, 433/434 and 435/436. The insulating layer 440 may be formed on each of the substrate 410, the first step difference layer 421 and the second step difference layer 422. Namely, a first insulating layer 441 may be located on the substrate 410, a second insulating layer 442 may be located on the first step difference layer 421, and a third insulating layer 443 may be formed on the second step difference layer 422.

In this case, an assembly side may be formed between each pair of the assembly electrodes 431/432, 433/434 and 435/436. Namely, a light emitting element may be assembled between each pair of the assembly electrodes 431 and 432, 433 and 434, and 435 and 436.

Figure 19:
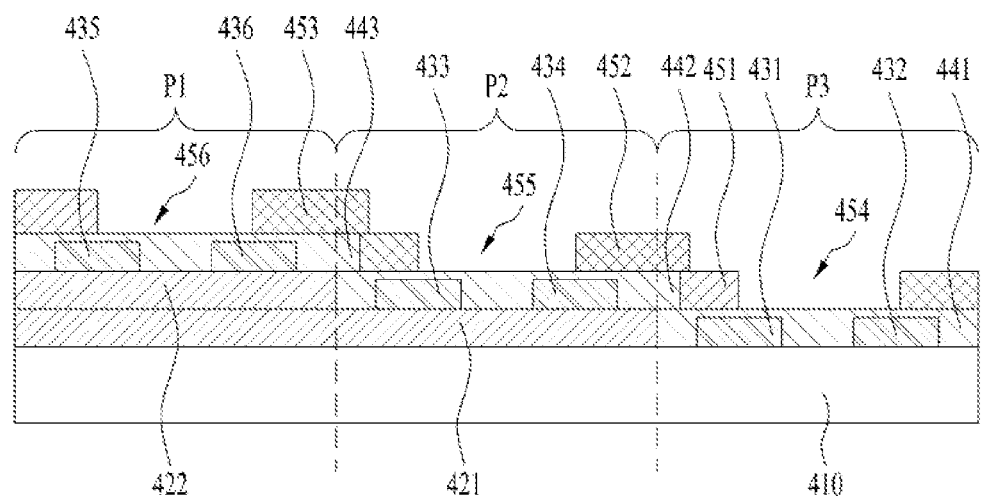

Thereafter, referring to FIG. 19, partition walls 451 to 453 defining assembly grooves, in which light emitting elements configuring individual pixels are installed, may be formed on the insulating layer 440.

By the partition walls 451 to 453, the assembly grooves 454 to 456 may be defined. Light emitting elements may be installed in the assembly grooves 454 to 456, respectively. For example, a blue light emitting element may be installed in the first assembly groove 454, a green light emitting element may be installed in the second assembly groove 455, and a red light emitting element may be installed in the third assembly groove 456.

In some implementations, the partition walls 451 to 453 may be formed in a manner of differing from each other in height. Namely, the partition wall may include a first partition wall 451 formed on the side of the first assembly groove 454, a second partition wall 452 formed on the side of the second assembly groove 455, and a third partition wall 453 formed on the side of the third assembly groove 456.

In this case, owing to the height differences among the partition walls 451 to 453, a portion having a height difference exists in an area other than the assembly grooves 454 to 456. For example, a step difference is generated from an area between the first assembly groove 454 and the second assembly groove 455 by the first partition wall 451 and the second partition wall 452.

As described above, the interference effect of enabling an electric field to work between pixel areas can be prevented owing to the height difference of an assembly side of each pixel area, thereby preventing an effect that a light emitting element is attached to a substrate surface other than an assembly groove.

In addition, even though the height difference is not significant, that is, even if some interfering electric fields exist, since a surface between the pixel areas is not flat (step shape), influence of a magnetic force becomes greater than that of the interfering electric field, so that a chip may be dragged and attached to an assembly groove in the course of a self-assembly process.

FIGS. 20 to 24 are schematic cross-sectional diagrams showing a process for fabricating a display device using a semiconductor light emitting element according to a second embodiment of the present disclosure.

Hereinafter, with reference to FIGS. 20 to 24, a process for fabricating a display device using a semiconductor light emitting element according to a second embodiment of the present disclosure will be described step by step.

Figure 20:
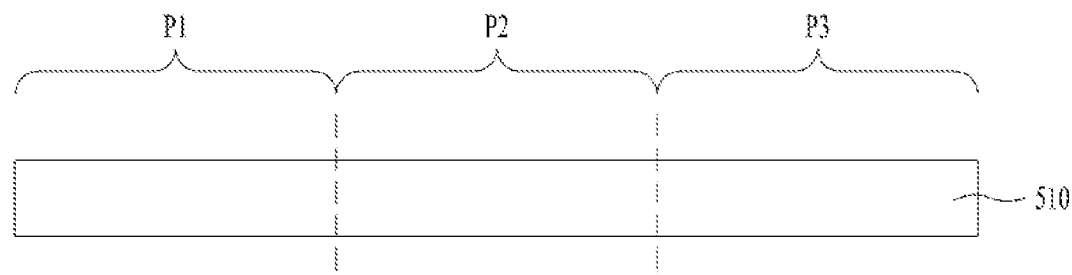
FIGS. 20 to 24 are schematic cross-sectional diagrams showing a process for fabricating a display device using a semiconductor light emitting element according to a second embodiment of the present disclosure.

Referring to FIG. 20, the following description will be made by taking an example that three pixel areas P1 to P3 are defined on a substrate 510. The three areas may correspond to a red area P1, a green area P2 and a blue area P3, respectively, by which the present disclosure is non-limited.

Figure 21:
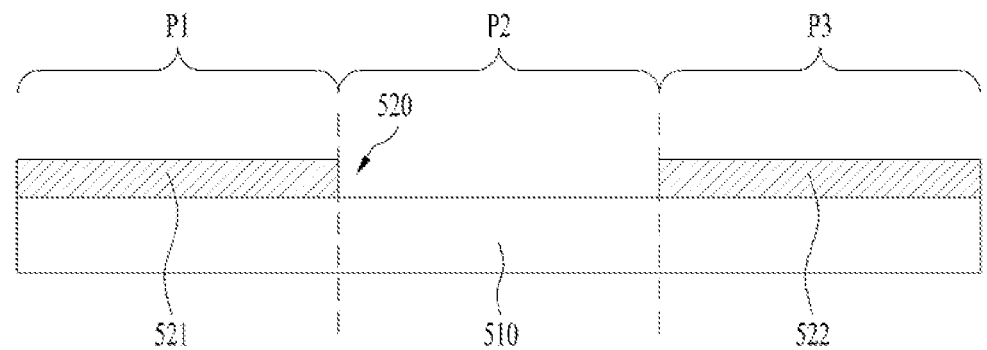

Referring to FIG. 21, a step difference layer 520 may be formed on the substrate 510. Specifically referring to FIG. 21, a step difference layer 521 may be formed on each of the two pixel areas P1 and P2 of the substrate 510. Thus, by the step difference layer 520, the red area P1, the green area P2 and the blue area P3 may be formed in a step shape to have different heights alternately. In this case, the height of the red area P1 may be equal to that of the blue area P3. Moreover, the green area P2 may have the same height of the red area neighboring the blue area P3.

Figure 22:
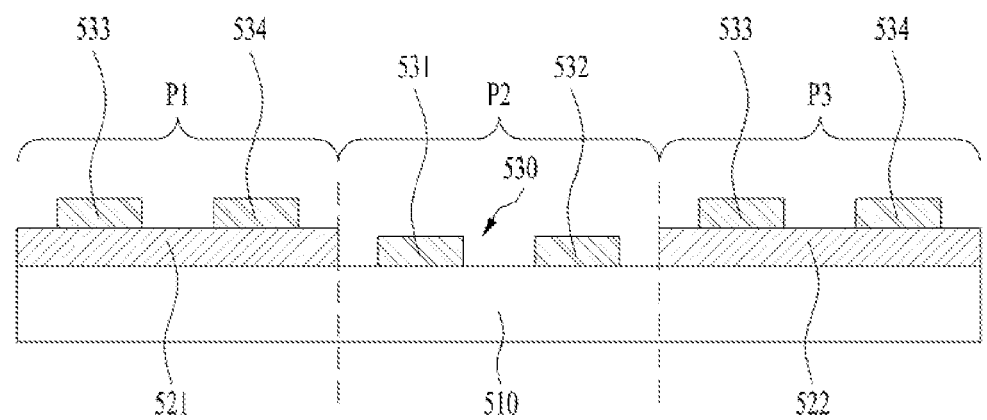

Referring to FIG. 22, an assembly electrode 530 may be formed on the substrate 510 and the step difference layer 520.

Namely, a pair of assembly electrodes 531 and 532 and a pair of assembly electrodes 533 and 534 may be formed on the substrate 410 and each of the step difference layers 521, respectively.

Figure 23:
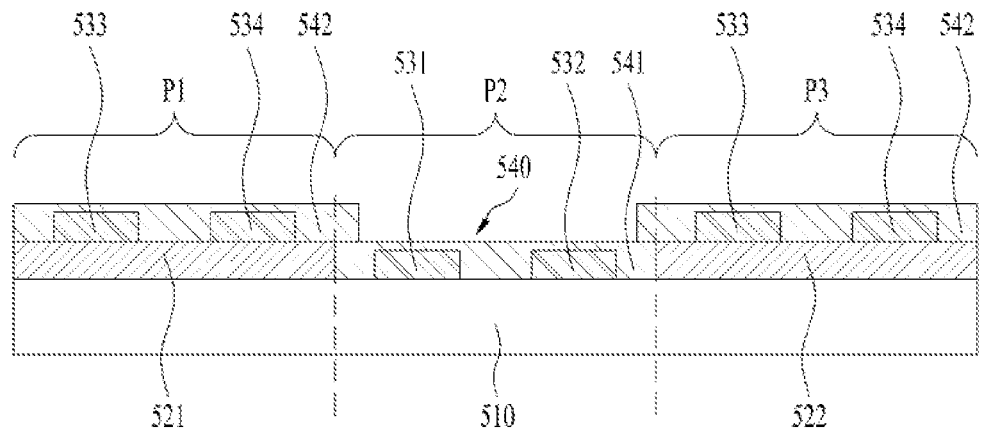

Referring to FIG. 23, an insulating layer 540 may be formed to cover the assembly electrodes 531/532 and 533/534. The insulating layer 540 may be formed on each of the substrate 410 and the step difference layer 520. Namely, a first insulating layer 541 may be located on the substrate 510 and a second insulating layer 542 may be formed on the individual step difference layer 521.

In this case, an assembly side may be formed between each pair of the assembly electrodes 531/532 and 533/534. Namely, a light emitting element may be assembled between each pair of the assembly electrodes 531/532 and 533/534.

Figure 24:
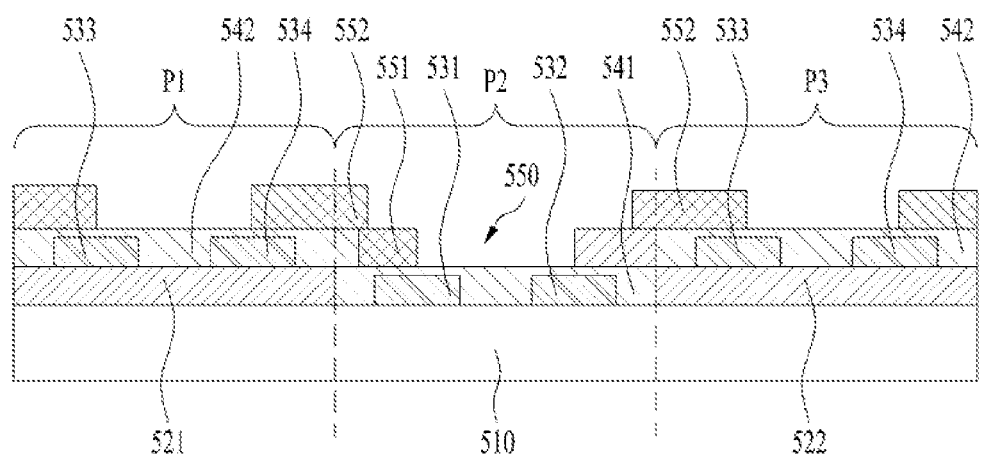

Thereafter, referring to FIG. 24, a partition wall 550 defining an assembly groove, in which a light emitting element configuring an individual pixel is installed, may be formed on the insulating layer 540.

Such partition walls 551 and 552 may be formed on the first insulating layer 541 and the second insulating layer 542, respectively, and the assembly grooves may be defined by the partition walls 551 and 552, respectively. A light emitting device may be installed in each of the assembly grooves.

In some implementations, the partition walls 551 and 552 may be formed in a manner of differing from each other in height. Namely, the partition wall may include a first partition wall 551 formed on the first insulating layer 541 and a second partition wall 552 formed on the second insulating layer 542.

In this case, due to the height difference between the partition walls 551 and 552, there exists a height difference generated portion exists in an area other than each assembly groove.

As described above, the interference effect of enabling an electric field to work between pixel areas can be prevented owing to the height difference of an assembly side of each pixel area, thereby preventing an effect that a light emitting element is attached to a substrate surface other than an assembly groove.

In addition, even though the height difference is not significant, that is, even if some interfering electric fields exist, since a surface between the pixel areas is not flat (step shape), influence of a magnetic force becomes greater than that of the interfering electric field, so that a chip may be dragged and attached to an assembly groove in the course of a self-assembly process.

The above description of the first embodiment may exactly apply to the parts failing to be described in the second embodiment.

FIGS. 25 to 33 are perspective diagrams showing a process for fabricating a display device using a semiconductor light emitting element according to a third embodiment of the present disclosure.

Hereinafter, with reference to FIGS. 25 to 33, a process for fabricating a display device using a semiconductor light emitting element according to a third embodiment of the present disclosure will be described step by step.

Figure 25:
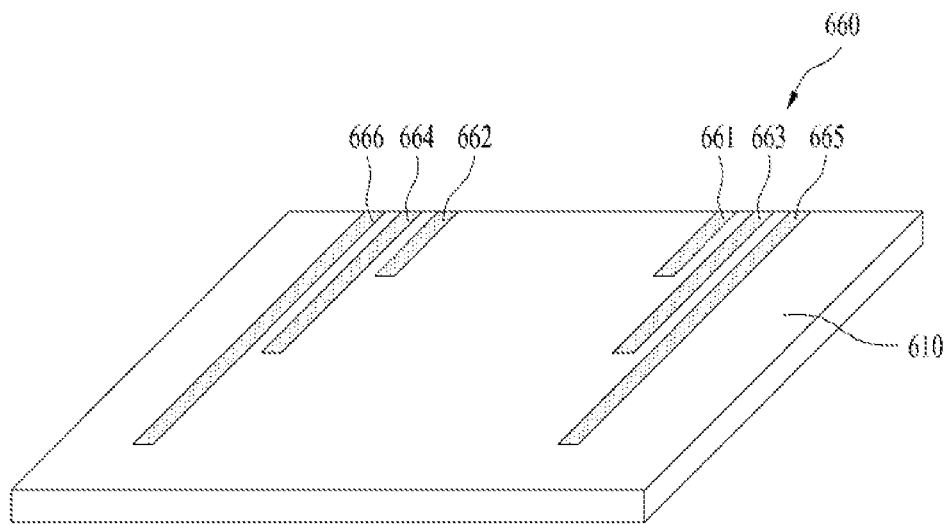
FIGS. 25 to 33 are perspective diagrams showing a process for fabricating a display device using a semiconductor light emitting element according to a third embodiment of the present disclosure.

Referring to FIG. 25, the following description will be made by taking an example that three pixel areas are formed on a substrate 610. The three areas may correspond to a red area, a green area and a blue area, respectively, by which the present disclosure is non-limited.

As shown in FIG. 25, a lightning electrode 660 may be formed on a substrate 610. The lightning electrode 660 may be connected to a light emitting element assembled in a pixel area later. Namely, current is applied through the lightning electrode 660, whereby the light emitting element can emit light.

Thus, three pairs of lightning electrodes 661/662, 663/664 and 665/666 capable of assembling three light emitting elements may be formed on the substrate 610.

Figure 26:
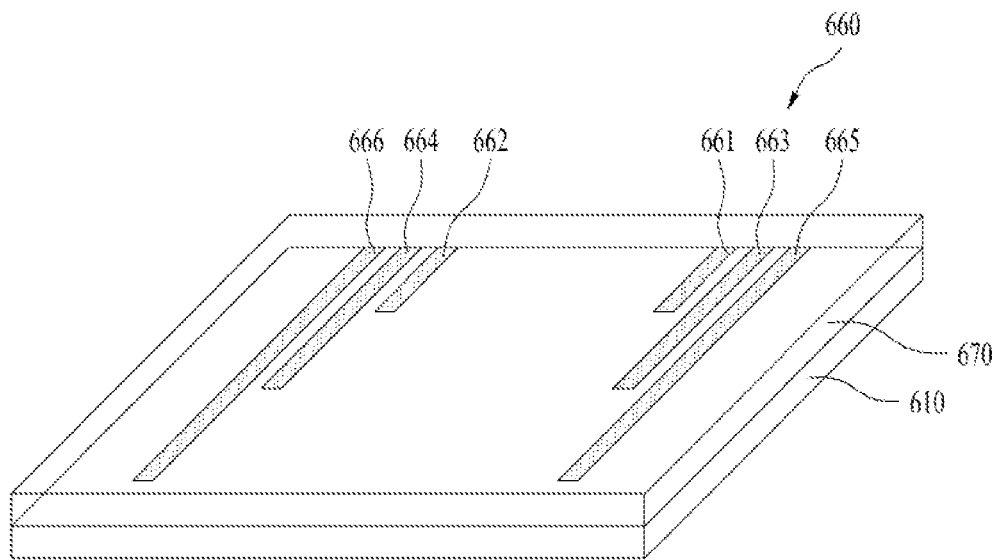

Referring to FIG. 26, an insulating layer 670 covering the three pairs of lightning electrodes 661/662, 663/664 and 665/666 may be formed on the substrate 610.

Figure 27:
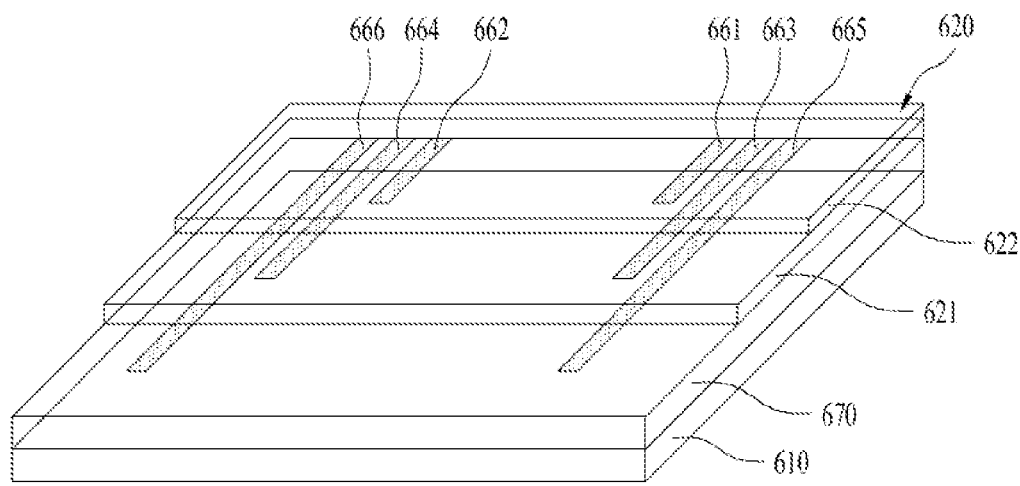

Referring to FIG. 27, a step difference layer 620 may be formed on the insulating layer 670. Specifically, a first step difference layer 621 and a second step difference layer 622 located on the first step difference layer 621 may be formed on the substrate 670.

As shown in the drawing, the first step difference layer 621 may be formed on two pixel areas P1 and P2 among three pixel areas P1 to P3.

In addition, the second step difference layer 622 may be formed in the single pixel area P1 on the first step difference layer 621 only. Hence, the respective pixel areas may be formed in a step shape to have sequential heights, respectively.

Figure 28:
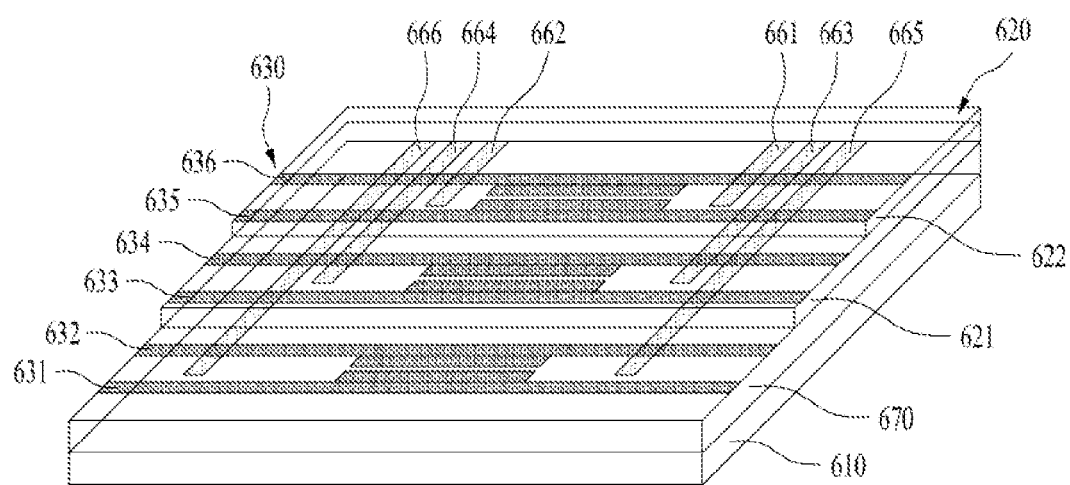

Referring to FIG. 28, an assembly electrode 630 may be formed on the insulating layer 670, the first step difference layer 621 and the second step difference layer 630.

Namely, three pairs of assembly electrodes 631/632, 633/634 and 635/636 may be formed on the insulating layer 670, the first step difference layer 621 and the second step difference layer 630, respectively.

Figure 29:
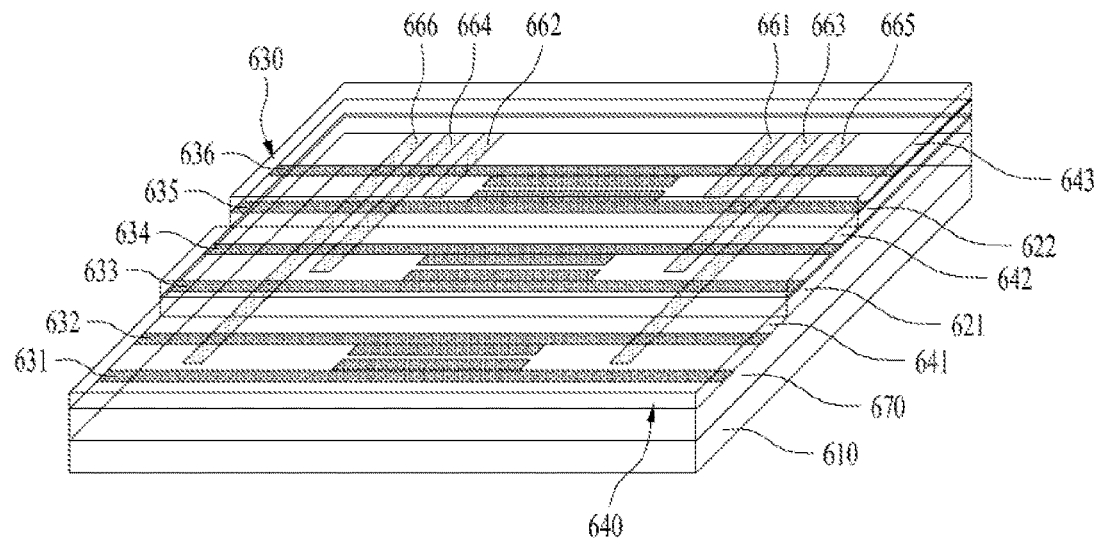

Referring to FIG. 29, an insulating layer covering the assembly electrodes 631/632, 633/634 and 635/636 may be formed. The insulating layer 640 may be formed on each of the insulating layer 670, the first step difference layer 621 and the second step difference layer 630. Namely, a first insulating layer 641 is located on the insulating layer, 670, a second insulating layer 642 may be located on the first step difference layer 621, and a third insulating layer 643 may be located on the second step difference layer 622.

In this case, an assembly side may be formed between each of the pairs of thee assembly electrodes 631/632, 633/634 and 635/636. Namely, a light emitting element may be assembled between each of the pairs of the assembly electrodes 631/632, 633/634 and 635/636.

Figure 30:
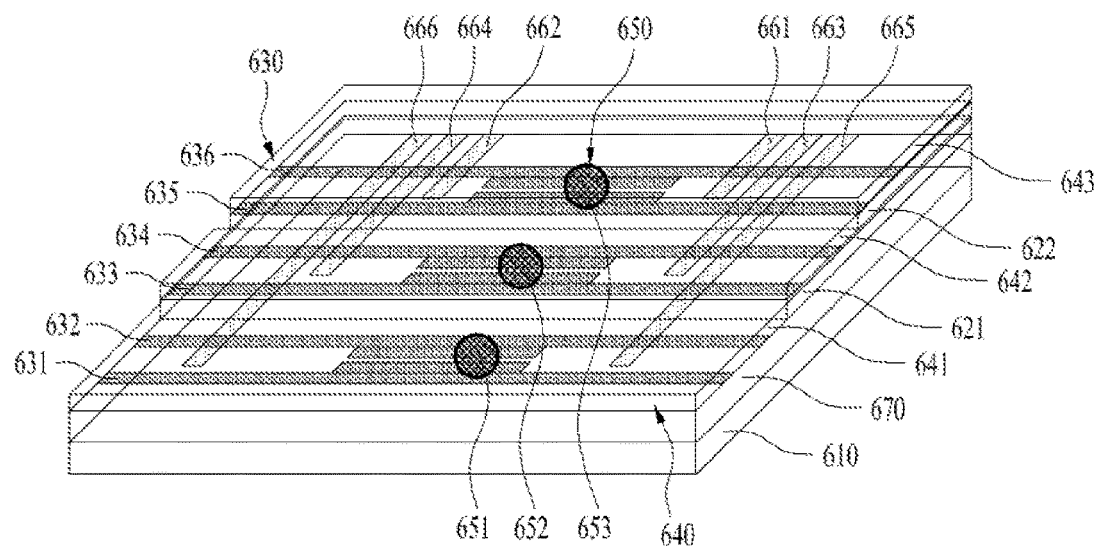

Referring to FIG. 30, partition wall 650 (see FIG. 34) defining an assembly groove 650, in which a light emitting element configuring an individual pixel is installed, may be formed on the insulating layer 6440. For clarity of description, the partition wall is omitted. By the partition wall 650, each of assembly grooves 651 to 653 may be defined.

Figure 31:
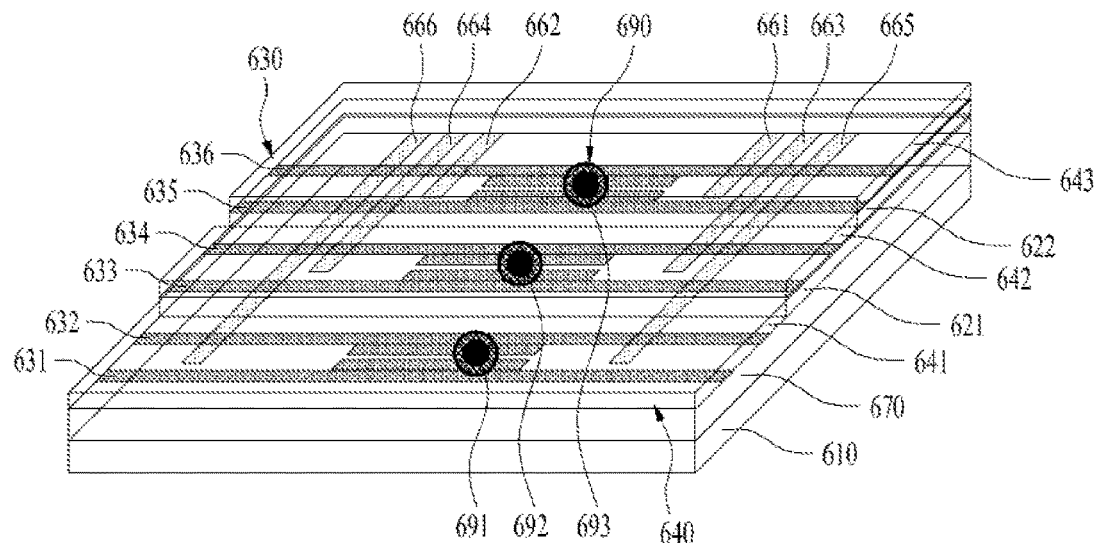

Referring to FIG. 31, a light emitting element 690 may be installed in each of the assembly grooves 651 to 653, respectively. For example, a blue light emitting element 691 may be installed in the first assembly groove 651, a green light emitting element 692 may be installed in the second assembly groove 62, and a red light emitting element 693 may be installed in the third assembly groove 653.

Figure 32:
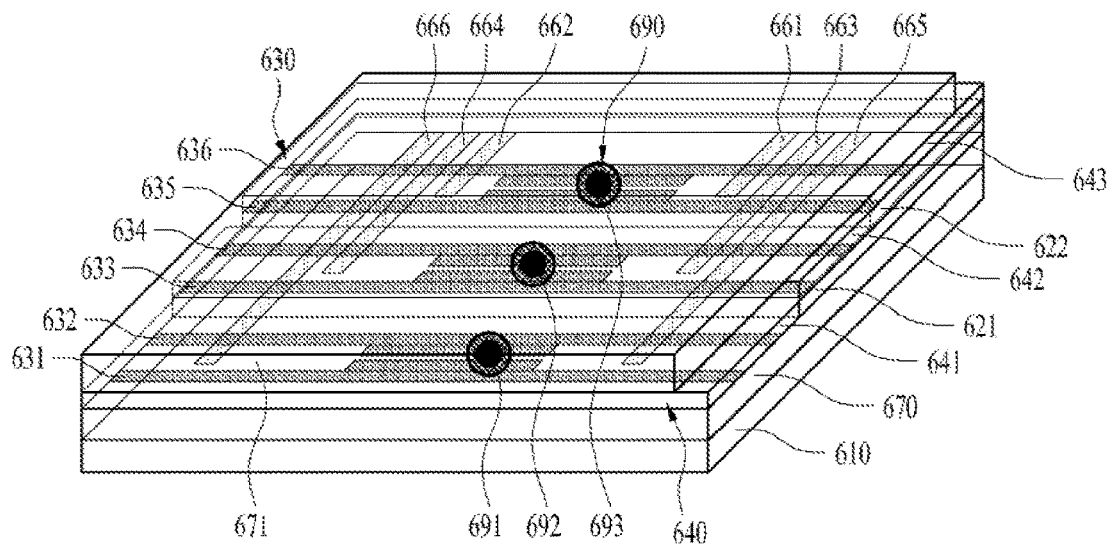

Referring to FIG. 32, the above-installed light emitting element 690 is fixed and a protective layer 671 may be formed. In this case, the protective layer 671 may planarize a height difference caused by the step difference layer 620.

Figure 33:
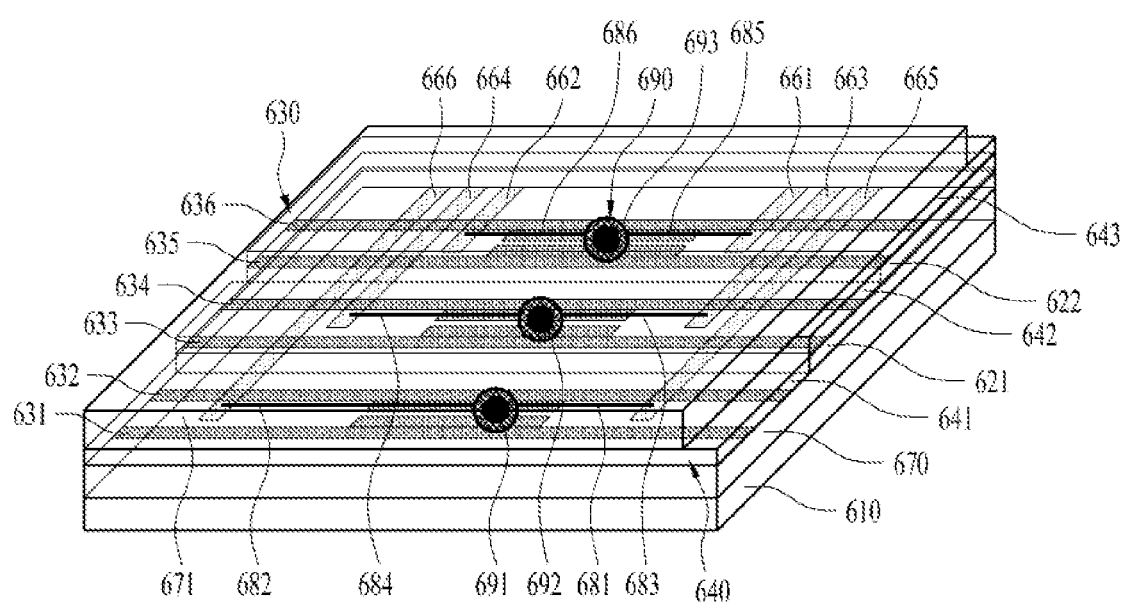

Referring to FIG. 33, lighting electrodes 681 to 686 may be connected to the light emitting element 690. For example, a first electrode 685 and a second electrode 686 connected to two electrodes of a red light emitting element 693 may be formed. And, a first electrode 683 and a second electrode 684 connected to two electrodes of a green light emitting element 692 may be formed. Moreover, a first electrode 683 and a second electrode 684 connected to two electrodes of a blue light emitting element 691 may be formed.

Figure 34:
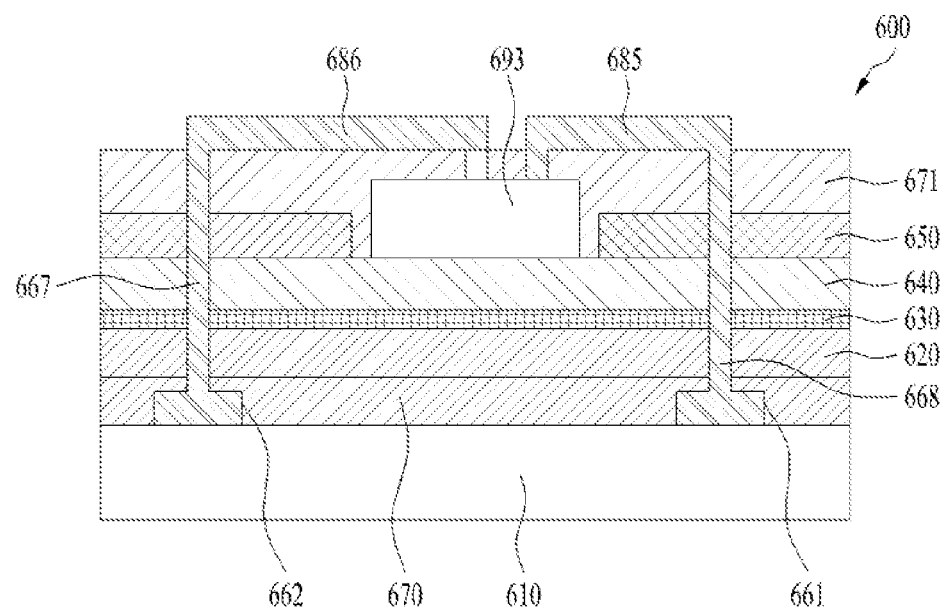
FIG. 34 is a cross-sectional diagram showing a pixel area shown in FIG. 33.

FIG. 34 is a cross-sectional diagram showing a pixel area shown in FIG. 33.

For example, FIG. 34 shows a cross-sectional structure of an area in which the red light emitting element 693 is installed. Namely, FIG. 34 shows a cross-sectional structure of the area in which the red light emitting element 693 fabricated by the above-described process is installed.

Referring to FIG. 34, the lighting electrodes 661 and 662 are located on the substrate 610, and the insulating layer 670 covering the lighting electrodes 661 and 662 is located thereon.

The step difference layer 620 is located on the insulating layer 670, and the assembly electrode 630 is located on the step difference layer 620.

The insulating layer 640 is located on the assembly electrode 630, and the partition wall 650 defining the assembly groove of the individual element area is located on the insulating layer 640. A top side of the insulating layer 640 located in the assembly groove may mean an assembly side.

The light emitting element 693 is installed in the assembly groove, and the protective layer 671 covering and planarizing the light emitting element 693 is located.

The first and second electrodes 685 and 686 electrically connected to the two electrodes 697 and 699 (see FIG. 35) of the light emitting element 693 are located on the protective layer 671. The first and second electrodes 685 and 686 may be electrically connected to the lighting electrodes 661 and 662, respectively. For example, the first and second electrodes 685 and 686 may be connected to the lighting electrodes 661 and 662 via the perforating electrodes 667 and 668, respectively.

As described above, the interference effect of enabling an electric field to work between pixel areas can be prevented owing to the height difference of an assembly side of each pixel area, thereby preventing an effect that a light emitting element is attached to a substrate surface other than an assembly groove.

In addition, even though the height difference is not significant, that is, even if some interfering electric fields exist, since a surface between the pixel areas is not flat (step shape), influence of a magnetic force becomes greater than that of the interfering electric field, so that a chip may be dragged and attached to an assembly groove in the course of a self-assembly process.

Figure 35:
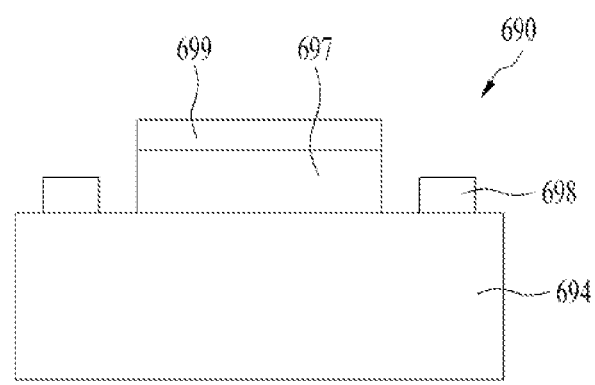
FIG. 35 is a cross-sectional diagram showing one example of a light emitting element used for a display device of the present disclosure.

FIG. 35 is a cross-sectional diagram showing one example of a light emitting element used for a display device of the present disclosure.

Referring to FIG. 35, one example of a horizontal light emitting element described above with reference to FIG. 4 is illustrated.

Such a light emitting element 690 is configured in a manner that a p-type semiconductor layer 697 is located on an n-type semiconductor layer 694. Between the n-type semiconductor layer 694 and the p-type semiconductor layer 697, an active layer (not shown) that emits light is located.

As shown in the drawing, the p-type semiconductor layer 697 is formed to have a size smaller than that of the n-type semiconductor layer 694, and an n-type electrode 698 is located on the exposed portion. In addition, the p-type semiconductor layer 699 is located on the n-type semiconductor layer 697.

In this case, the p-type electrode 699 may include a transparent conductive layer such as ITO.

The above description is merely illustrative of the technical spirit of the present disclosure. It will be apparent to those skilled in the art that various modifications and variations can be made in the present disclosure without departing from the spirit and scope of the disclosure.

Therefore, the embodiments disclosed in the present disclosure are merely illustrative of the technical spirit of the present disclosure. The scope of the technical spirit of the present disclosure is not limited by these embodiments.

The scope of the present disclosure should be construed by the appended claims, and all technical ideas within the scope equivalent thereto should be construed as being within the scope of the present disclosure.

INDUSTRIAL APPLICABILITY

The present disclosure may provide a light emitting device using a semiconductor light emitting element in size of micrometer (μm) unit.

What is claimed is:

1. A display device using a semiconductor light emitting element, the display device comprising:
    a substrate;
    a step difference layer located in at least some pixel areas among a plurality of individual pixel areas located on the substrate;
    an assembly electrode located on the substrate or the step difference layer;
    an insulating layer located on the assembly electrode;
    a partition wall located on the insulating layer to define an assembly groove;
    the semiconductor light emitting element installed in the assembly groove to correspond to a pixel; and
    a lighting electrode electrically connected to the semiconductor light emitting element,
    wherein the display device comprises a plurality of partition walls each including a step shape between pixels.

2. The display device of claim 1, wherein a height of the partition wall varies between pixel areas based on the step difference layer.

3. The display device of claim 1, wherein the display device comprises a red pixel area, a green pixel area, and a blue pixel area, and
    wherein a height of an assembly position of one of the red, green, and blue pixel areas is different from respective heights of assembly positions of each of the two remaining pixel areas based on the step difference layer.

4. The display device of claim 3, wherein adjacent assembly positions within each of the red, green, and blue pixel areas differ from each other in height.

5. The display device of claim 1, wherein the plurality of the individual pixel areas include a red pixel area, a green pixel area, and a blue pixel area, and
    wherein respective heights of assembly positions of the red, green, and blue pixel areas differ from each other based on the step difference layer.

6. The display device of claim 5, wherein heights of the assembly positions of the red, green, and blue pixel areas are sequentially different.

7. The display device of claim 1, further comprising a protective layer between the semiconductor light emitting element and the lighting electrode.

8. The display device of claim 7, wherein the protective layer is planar to compensate for height differences caused by the step difference layer.

9. A method of fabricating a display device using a semiconductor light emitting element, the method comprising:

forming a step difference layer on at least some pixel areas among a plurality of individual pixel areas located on a substrate;

forming an assembly electrode on the substrate or the step difference layer;

forming an insulating layer on the assembly electrode;

forming a partition wall on the insulating layer to define an assembly groove;

installing the semiconductor light emitting element in the assembly groove to correspond to a pixel; and forming a lighting electrode electrically connected to the semiconductor light emitting element, wherein the display device comprises a plurality of partition walls each including a step shape between pixels.

10. The method of claim 9, wherein the plurality of individual pixel areas comprises a first, a second, and a third pixel area repeatedly located on the substrate, and the step difference layer is formed in at least one of the first pixel area, the second pixel area, or the third pixel area.

11. The method of claim 9, wherein the plurality of individual pixel areas comprises a first, a second, and a third pixel area repeatedly located on the substrate, and forming the step difference layer comprises forming a first step difference layer in two of the first to third pixel areas.

12. The method of claim 9, wherein the plurality of individual pixel areas comprises a first, a second, and a third pixel area repeatedly located on the substrate, and forming the step difference layer comprises forming a first step difference layer alternatingly throughout the plurality of individual pixel areas.

13. The method of claim 11, wherein the first step difference layer is formed continuously in the two of the first to third pixel areas.

14. The method of claim 13, further comprising forming a second step difference layer covering one pixel area of the two of the first to third pixel areas on which the first step difference layer is continuously formed.

15. A display device using a semiconductor light emitting element, the display device comprising:

a substrate;

an insulating layer located on the substrate;

a partition wall located on the insulating layer to define individual pixel areas;

the semiconductor light emitting element installed in an individual pixel area;

a lighting electrode electrically connected to the semiconductor light emitting element;

a step difference layer located in at least some areas between individual pixel areas to vary a height of a surface on which a respective semiconductor light emitting element is installed; and a protective layer disposed between the light emitting element and the lighting electrode, wherein the partition wall includes a step shape between individual pixels.

16. The display device of claim 15, wherein a height of the partition wall varies between individual pixels based on the step difference layer.

17. The display device of claim 15, wherein the protective layer is planar to compensate for height differences caused by the step difference layer.

18. The display device of claim 15, wherein a step-shaped space is formed between adjacent individual pixel areas by the insulating layer having a change in height.

* * * * *